(12) United States Patent
Matano

(10) Patent No.: US 6,469,546 B2
(45) Date of Patent: Oct. 22, 2002

(54) SENSE AMPLIFIER CIRCUIT

(75) Inventor: Tatsuya Matano, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/860,632

(22) Filed: May 21, 2001

(65) Prior Publication Data

US 2002/0000838 A1 Jan. 3, 2002

(30) Foreign Application Priority Data

May 19, 2000 (JP) ........................................ 2000-148860

(51) Int. Cl.[7] .............................................. G01R 19/00
(52) U.S. Cl. ........................................ 327/51; 365/207
(58) Field of Search ............................. 327/51, 52, 55, 327/57, 89, 563; 365/203, 205, 207, 208

(56) References Cited

U.S. PATENT DOCUMENTS 5,982,690 A * 11/1999 Austin ......................... 327/51
6,225,834 B1 * 5/2001 Gang .......................... 327/51
6,226,207 B1 * 5/2001 Suh ............................ 327/51
6,239,624 B1 * 5/2001 Yang et al. .................. 327/51

OTHER PUBLICATIONS

Heller L. G., "Cross–Coupled Charge–Transfer Sense Amplifier", ISSCC Digest of Technical Papers, pp20–21, Feb. 1979.
Tsukude M. et al., "A 1/2 V to 3.3 V Wide–Voltage–Range DRAM with 0.8 V Array Operation", ISSCC Digest of Technical Papers, pp66–67, Feb 1997.

* cited by examiner

Primary Examiner—My-Trang Nu Ton
(74) Attorney, Agent, or Firm—Young & Thompson

(57) ABSTRACT

A sense amplifier circuit including a current difference amplification circuit and a voltage difference amplification circuit, and a precharge circuit for precharging digit lines, are provided between the digit lines. A memory cell including one transistor and one capacitor is connected to the digit line. The voltage difference amplification circuit includes an n-channel flip flop and a p-channel flip flop, and is provided with nodes. The nodes are connected to the digit lines via a sense amplifier connection circuit.

13 Claims, 17 Drawing Sheets

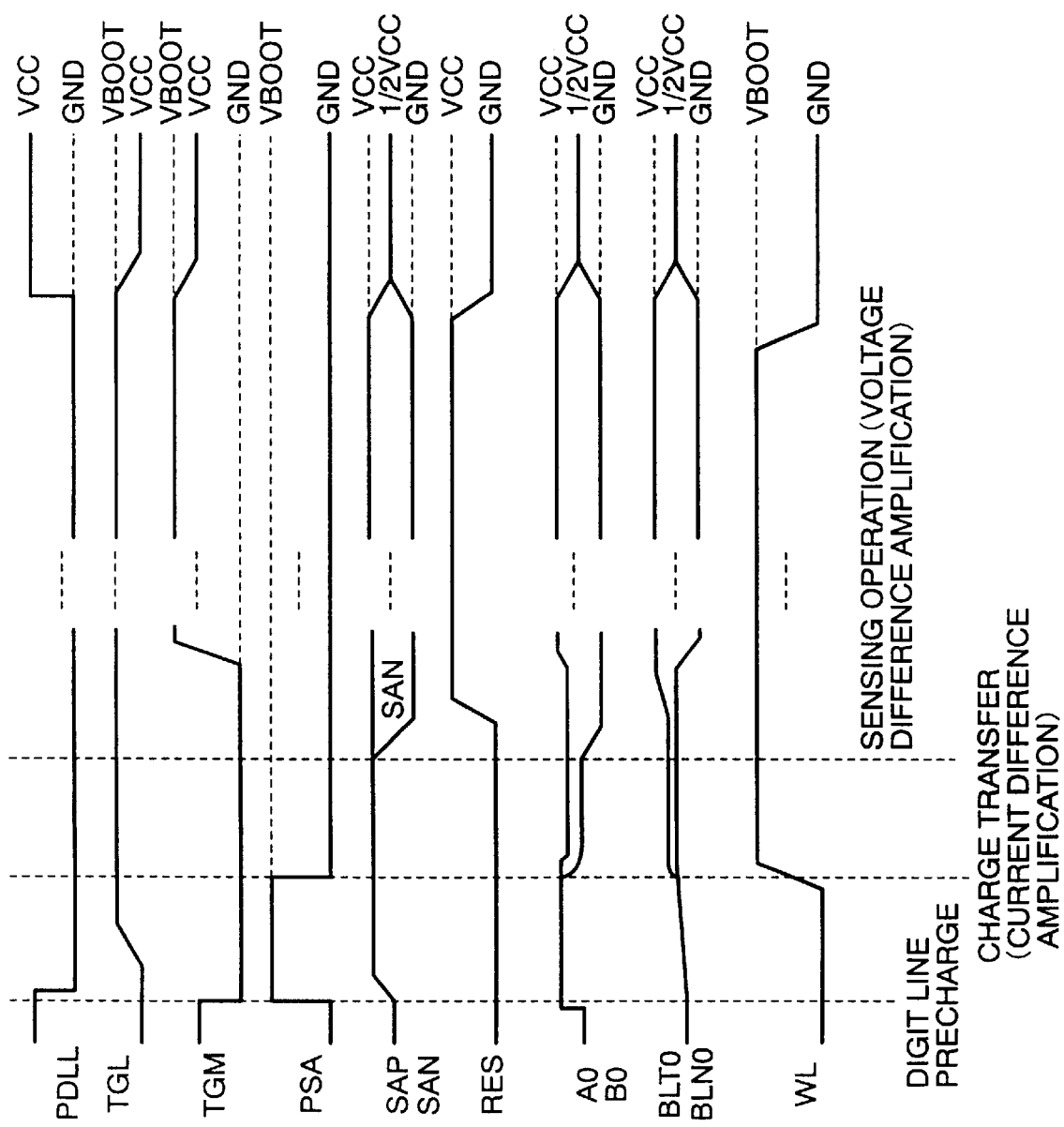

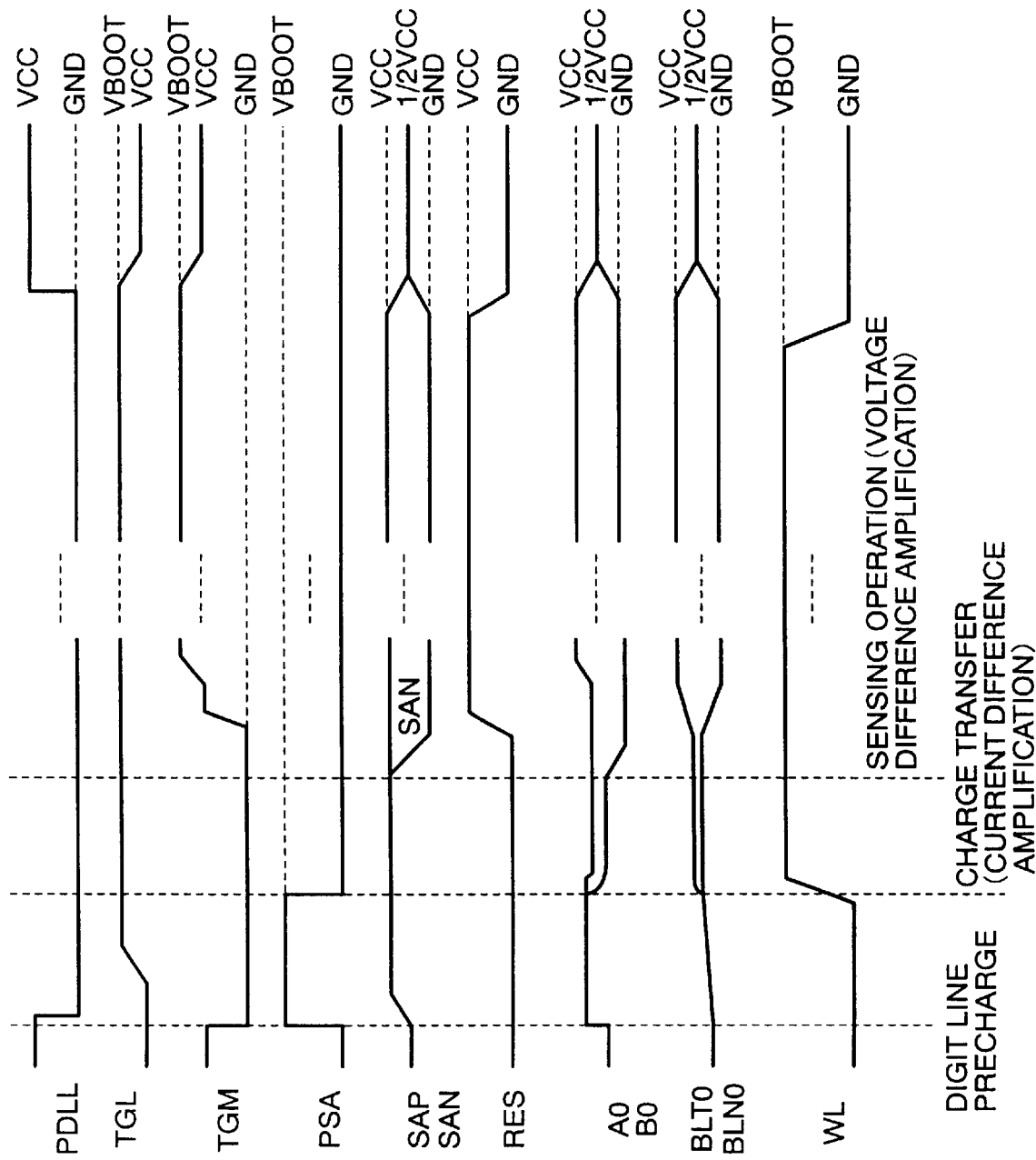

SENSE AMPLIFIER CIRCUIT

BACKGROUND OF THE INVENTION

1. Field of the Invention

The present invention relates to a sense amplifier circuit incorporated in a circuit having complementary data lines. More particularly, the present invention relates to a sense amplifier circuit incorporated in a dynamic random access memory (hereinafter referred to as a "DRAM"), etc., which requires a memory holding operation, which operates even with a low power supply voltage, which has a reduced power consumption, and which has a high data amplification speed.

2. Description of the Related Art

Recently, the increase in the application of semiconductor memory devices to portable equipments has prompted a reduction in the voltage of the semiconductor memory devices. Particularly, among other semiconductor memory devices, DRAMs, which require a memory holding operation, have a reduced voltage. The operating power supply voltage of some DRAMs is 2.5 V or less. For such DRAMs whose voltage has been reduced, the operation margin of a sense amplifier circuit has been an issue to be solved. The initial signal voltage ΔVsig from a memory cell of a sense amplifier circuit is represented by Expression 1 below.

$$\Delta Vsig = (1/2\ Vcc)/(1 + Cb/Cs) \quad \text{(Expression 1)}$$

(Vcc: operating power supply voltage, Cb: bit line capacitance, Cs: memory cell capacitance)

As shown in Expression 1 above, a reduction in the operating power supply voltage Vcc reduces the initial signal voltage ΔVsig, thereby reducing the operation margin of the sense amplifier. In view of this, it has been proposed in the prior art to perform a sense amplification operation after the initial signal voltage ΔVsig is increased in the sense amplifier circuit (Heller, L. G., "Cross-Coupled Charge-Transfer Sense Amplifier," ISSCC Digest of Technical Papers, pp20–21, Febuary, 1979 (conventional example 1)).

FIG. 1 is a circuit diagram illustrating a sense amplifier circuit of conventional example 1, FIG. 2 is a block diagram of FIG. 1, and FIG. 3 is a timing chart illustrating the operation of the sense amplifier circuit of the conventional example 1.

The sense amplifier circuit of the conventional example 1 uses n-channel MOS transistors. The sense amplifier circuit includes a pre-amplifier including transistors T5 and T6, and an n-channel flip flop including transistors T3 and T4. The sources of the transistors T3 and T5 are connected to each other, and the gates thereof are connected to a node D2 in the sense amplifier. The sources of the transistors T4 and T6 are connected to each other, and the gates thereof are connected to a node D1 in the sense amplifier. A sense amplifier driving line V5 is connected to the drains of the transistors T3 and T4.

A sense amplifier potential pull-up signal line V2 is connected to the gate of each of the transistors T5 and T6 via a capacitor C1. The node D2 is provided between the transistor T4 and the transistor T6, and the source of a transistor T2 is connected to the node D2 therebetween. The transistor T2 is provided with a terminal 102 at its drain, and a sense amplifier driving potential (hereinafter referred to as "VI") is applied to the terminal 102. Similarly, the node D1 is provided between the transistor T3 and the transistor T5, and the source of a transistor T1 is connected to the node D1 therebetween. The transistor T1 is provided with a terminal 102 at its drain, and VI is applied to the terminal 102.

A digit line D6 is connected to the drain of the transistor T6. The digit line D6 is connected to the sources of transistors T8 and T10. The drain of the transistor T8 is connected to a terminal 103. A digit line high potential (hereinafter referred to as "VH") is applied to the terminal 103. A digit line pull-up signal line V3 is connected to the gate of the transistor T8, and a digit line pull-down signal line V4 is connected to the gate of the transistor T10.

A memory cell including one transistor 100 and one capacitor 101 is connected to the digit line D6, and a word line WL is connected to the memory cell. The sense amplifier circuit is incorporated in a DRAM, and has a left-right symmetric configuration. A digit line D5 is connected to the drain of the transistor T5. The configurations of transistors T7 and T9 and the memory cell which are connected to the digit line D5 are the same as those which are connected to the digit line D6, and thus will not be further described below.

As illustrated in FIG. 2 which is a block diagram of the conventional example 1, an n-channel flip flop 110, a precharge circuit 111, and a digit line VH precharge circuit 112 for precharging the digit lines D5 and D6 to the potential of VH, are connected in parallel between complementary bit lines BLT0 and BLN0. The transistor T5 is provided along the bit line BLT0 between the precharge circuit 111 and the digit line VH precharge circuit 112, and the transistor T6 is provided along the bit line BLN0 therebetween. The gate of the transistor T5 is connected to the complementary bit line BLN0, and the gate of the transistor T6 is connected to the bit line BLT0.

Next, the operation of the conventional example 1 will be described. As illustrated in FIG. 3, at the beginning of the operation, the digit lines D5, D6 are precharged from GND to VI-Vth (transistor threshold potential) via the transistors T1 and T5, and T2 and T6, respectively. As the potential of the word line WL transitions to a high level, a large potential difference occurs between the nodes D1 and D2 due to a charge transfer. VI-Vth is about VH/2. Thus, the capacitance of the digit lines D5 and D6 is greater than that of the nodes D1 and D2.

Then, when the word line WL rises and if the digit line D6 side is at a low level, the gate-source potential VGS of the transistor T6 becomes greater than the threshold potential Vth of the transistor T6, thereby turning ON the transistor T6, whereby a charge moves from the node D2 to the digit line D6. At this time, on the node D2 side, due to the capacitance difference between the digit line D6 and the node D2, a potential difference greater than that occurring on the digit line D6 side occurs when the word line WL rises.

Then, when the potential of the sense amplifier pull-up signal line V2 transitions to the high level, the potential difference between the nodes D1 and D2 has a magnitude which is at least Vth or more of the transistors T5 and T6 (n-channel transistors) due to the capacitor C1. Thereafter, the digit lines D5 and D6 are precharged to VH by the transistors T7 and T8, respectively, and the potentials at the nodes D1 and D2 and the digit lines D5 and D6 are amplified to the high level or the low level by turning ON the transistors T3 and T4 while bringing the potential of the sense amplifier driving line V5 to the low level so as to activate the n-channel flip flop. Then, at the end of the operation, the potential of the word line WL is brought to the low level and the potential of the sense amplifier driving line V5 is brought to the high level so as to turn OFF the n-channel flip flop, and the potential of the digit line pull-down signal line V4 is brought to the high level so as to reduce the potential of the digit lines D5 and D6 to GND.

As another method for sense-amplifying an initial voltage signal, for example, Tsukude, M., et al. "A 1/2 V to 3.3 V Wide-Voltage-Range DRAM with 0.8 V Array operation," ISSCC Digest of Technical Papers, pp66–67, Febuary, 1997 (conventional example 2) has been proposed in the art. FIG. 4 is a circuit diagram illustrating a sense amplifier circuit of conventional example 2, FIG. 5 is a block diagram of FIG. 4, and FIG. 6 is a timing diagram illustrating the operation of the sense amplifier circuit of the conventional example 2.

The sense amplifier circuit of the conventional example 2 has a CMOS configuration, and includes two p-channel flip flops 123, one n-channel flip flop 124, sense amplifier (hereinafter referred to also as "SA") section precharge transistors T13 and T14, and digit line-SA separation transistors T11 and T12.

A memory cell including one transistor 127 and one capacitor 128 is connected to a digit line BLT0. A word line WL is connected to the gate of the transistor 127. A digit line BLN0 which is opposing and complementary to the digit line BLT0 is provided. As the digit line BLT0, the digit line BLN0 is provided with a memory cell (not shown). A digit line BLT1 which extends collinearly with the digit line BLT0 is provided. A digit line BLN1 which is opposing and complementary to the digit line BLT1 is provided. Data transfer lines IOT and ION are provided between the digit lines BLT0 and BLN0. The data transfer line IOT and the digit line BLT0 are connected to each other via a transistor 125, and the data transfer line ION and the digit line BLN0 are connected to each other via a transistor 126. A column selection line YSW is connected to the gates of the transistors 125 and 126.

The digit line BLT0 is provided with the transistor T11, and the digit line BLN0 is provided with the transistor T12. A digit line connection signal line SG0 is connected to the gates of the transistors T11 and T12. Similarly, the digit line BLT1 and the digit line BLN0 are provided with transistors T15 and T16, respectively, and a digit line connection signal line SG1 is connected to the gates of the transistors T15 and T16.

In a place adjacent to the memory cell, the sources of transistors 121 and 120 are connected to the digit line BLT0 and the digit line BLN0, respectively, and the source and the drain of a transistor 122 are connected to the digit lines BLT0 and BLN1. A digit line precharge signal line BREQ0 is connected to the gates of the transistors 120, 121 and 122. A precharge line 131 is connected to the sources of the transistors 120 and 121.

Moreover, the p-channel flip flop 123 is provided between the digit lines BLT0 and BLN0, and is connected to the digit lines BLT0 and BLN0. The flip flop 123 is connected to a power supply voltage line 134. The drains of the transistors T13 and T14 are connected to the digit lines BLT0 and BLN0, respectively. An internal power supply voltage line 132 is connected to the sources of the transistors T13 and T14. A sense amplifier precharge line 133 is connected to the gates of the transistors T13 and T14. The n-channel flip flop 124 is provided between the digit line BLT0 and the digit line BLN0. The flip flop 124 is connected to a ground potential line GND, and is provided with nodes E0 and E1.

The flip flop 123 and the transistors 120, 121 and 122 are provided between the digit line BLT1 and the digit line BLN1, as those provided between the digit line BLT0 and the digit line BLN0. A digit line precharge signal line BREQ1 is connected to the gates of the transistors 120, 121 and 122.

As illustrated in FIG. 5 which shows the conventional example 2 in a simplified form, the n-channel flip flop 124, a precharge circuit 130 and the p-channel flip flop 123 are connected in parallel between the digit line BLT0 and the digit line BLN0. The digit lines BLT0 and BLN0 are amplified by applying a signal whose potential transitions from GND to VSG to a digit line connection signal line SG.

Next, the operation of the conventional example 2 will be described. As illustrated in FIG. 6, before the sense amplifier circuit starts operating, the potentials of the digit line precharge signal lines BREQ0 and BREQ1 transition to Vcc, and the transistors 120 and 121 are turned ON, whereby the digit lines BLT0, BLN0, BLT1 and BLN1 are precharged to ½ Vcc. Moreover, the potential of the sense amplifier precharge line 133 transitions to VBOOT, and the SA section is precharged to a potential of Vcc(1+γ). Then, upon the start of the operation, the potential of the precharge line 133 transitions to the low level, thereby turning OFF the SA section precharge transistors T13 and T14, and the potential of the word line WL transitions to the high level, whereby the cell data is output to the digit lines BLT0 and BLN0. Then, by setting the potential of SG0 to the VSG potential, a charge transfer occurs from the nodes E0 and E1 to the digit lines BLT0 and BLN0, respectively, thereby causing a large potential difference between the nodes E0 and E1. Thereafter, the n-channel flip flop 124 and the p-channel flip flop 123 are activated, thereby amplifying the potential difference between the nodes E0 and E1 and the potential difference between the digit lines BLT0 and BLN0, respectively. Then, at the end of the operation of the sense amplifier circuit, the potential of the word line WL transitions to the low level, the SG0 potential to the GND level, and the potential of the precharge line 133 to the high level, thereby precharging the respective sections.

However, the conventional example 1 has the following problem. As described above, a digit line signal amount is generated after the digit lines D5 and D6 are precharged to a potential in the vicinity of VI-Vth via the transistors T5 and T6, respectively (VI precharge in the sense amplifier). Therefore, data amplification is started while either one of the transistors T5 and T6 is close to an ON state or an OFF state. Thus, in the conventional example 1, the ½ Vcc precharge method is not used, whereby the power consumption is increased because the digit lines D5 and D6 are brought up from GND to the VH level during operation. Moreover, the data read operation is slow because, for example, the pre-amplification operation by a precharge operation of the digit lines D5 and D6 or a charge transfer operation takes a long time, and the data low side is sensed/amplified after the data high side is charged.

On the other hand, in the conventional example 2, a digit line signal amount is generated from the digit lines BLT0, BLN0, BLT1 and BLN1 which have been precharged to a potential of ½ Vcc. Then, data amplification is started while either one of the transistors T11 and T12 is close to an ON state or an OFF state by bringing the gate potentials of the transistors T11 and T12 up to the appropriately set VSG potential. Thus, the conventional example 2 uses the ½ Vcc precharge method, thereby resulting in a power consumption smaller than that of the conventional example 1. However, it is necessary to increase the internal power supply potential VSG, Vcc(1+γ) for driving the sense amplifier. Moreover, since p-channel transistors are arranged on both sides of an n-channel transistor, the area of the circuit increases by the area required for n-well separation. Furthermore, since a fine control on the level of the internal power supply potential VSG is necessary, the circuit is susceptible to variations in VSG-Vth of a transistor, and the digit line signal amount may possibly be reduced.

Furthermore, both in the conventional example 1 and the conventional example 2, it is necessary to perform the data amplification operation through a charge transfer by operating a transistor with a voltage in the vicinity of the threshold voltage thereof.

SUMMARY OF THE INVENTION

An object of the present invention is to provide a sense amplifier circuit which has a sufficient sensing margin even when the power supply voltage is reduced, which has a reduced power consumption, and in which the influence of variations in the threshold voltage of a transistor can be reduced.

A sense amplifier circuit according to a first aspect of the invention is a sense amplifier circuit for amplifying a signal difference between complementary data lines of a semiconductor memory device. The sense amplifier circuit comprises a converting unit which converts a difference between respective currents flowing along the complementary data lines into a voltage difference: and amplifying unit which amplifies the voltage difference to a logic level so as to write the logic level back to the complementary data lines.

In the first aspect of the invention, the difference between the currents flowing along the respective complementary data lines is converted into a voltage difference, and the voltage difference is amplified to a logic level, after which a potential of the high or low level is written back to the complementary data lines. As a result, even if the operating voltage of the semiconductor memory device is reduced, thereby reducing the data signal amount of the data lines, it is possible to obtain a sufficient data signal amount.

A sense amplifier circuit according to a second aspect of the invention is a sense amplifier circuit for amplifying a signal difference between complementary data lines of a semiconductor memory device. The sense amplifier circuit comprises: a current difference amplification circuit for amplifying a potential difference between the complementary data lines by using a difference between respective currents flowing into the complementary data lines which occurs due to the potential difference between the complementary data lines; a pair of nodes which are connected to the current difference amplification circuit for outputting the amplified potential difference; a voltage difference amplification circuit connected to the nodes for amplifying the potential difference between the nodes into a logic level; a precharge circuit connected to the nodes for causing a current to flow from the current difference amplification circuit to the complementary data lines; and a sense amplifier connection circuit connected to the nodes and the complementary data lines for electrically connecting or disconnecting the nodes to or from the complementary data lines.

In the second aspect of the invention, the precharge circuit is used to cause a current to flow to the complementary data lines which already have a signal difference (potential difference) therebetween, after which a charge is transferred from the nodes to the complementary data lines and the potential difference between the complementary data lines is amplified by the current difference amplification circuit by using the current difference between the complementary data lines, thereby generating a large data signal amount at the nodes. Then, the potential difference is further amplified by the voltage difference amplification circuit to a logic level, after which the nodes and the complementary data lines are electrically connected to each other by the sense amplifier connection circuit, and data is written by applying a high or low potential to the complementary data lines. Thus, even if the power supply voltage of the semiconductor memory device is reduced, thereby reducing the signal difference of the complementary data lines, it is possible to generate a sufficient data signal amount at the nodes and to amplify the potential difference between the complementary data lines at a high speed.

In the sense amplifier circuit, for example, the current difference amplification circuit includes: a first transistor whose source is connected to one of the complementary data lines, whose drain is connected to one of the nodes, and whose gate is connected to the other one of the nodes; and a second transistor whose source is connected to the other one of the complementary data lines, whose drain is connected to the other one of the nodes, and whose gate is connected to the one of the nodes. The precharge circuit includes: a third transistor whose drain is connected to the one of the nodes, whose source is connected to a precharge power supply line of the nodes, and whose gate is connected to an activation signal line to which a precharge activation signal is input; a fourth transistor whose drain is connected to the other one of the nodes, whose source is connected to the precharge power supply line of the nodes, and whose gate is connected to the activation signal line to which the precharge activation signal is input; and a fifth transistor whose source and drain, or drain and source, are connected to the nodes, respectively, and whose gate is connected to the activation signal line to which the precharge activation signal is input. The voltage difference amplification circuit includes: a sense amplifier low side amplification circuit, including: a sixth transistor whose drain is connected to the one of the nodes, whose source is connected to a sense amplifier low side driving line, and whose gate is connected to the other one of the nodes; and a seventh transistor whose drain is connected to the other one of the nodes, whose source is connected to the sense amplifier low side driving line, and whose gate is connected to the one of the nodes; and a sense amplifier high side amplification circuit, including: an eighth transistor whose drain is connected to the one of the nodes, whose source is connected to a sense amplifier high side driving line, and whose gate is connected to the other one of the nodes; and a ninth transistor whose drain is connected to the other one of the nodes, whose source is connected to the sense amplifier high side driving line, and whose gate is connected to the one of the nodes. The sense amplifier connection circuit includes a tenth transistor and an eleventh transistor for connecting or disconnecting the complementary data lines to or from the nodes.

Alternatively, in the sense amplifier circuit, for example, the current difference amplification circuit includes: a first transistor whose source is connected to the one of the complementary data lines, whose drain is connected to the one of the nodes, and whose gate is connected to the other one of the nodes; and a second transistor whose source is connected to the other one of the complementary data lines, whose drain is connected to the other one of the nodes, and whose gate is connected to the one of the nodes. The precharge circuit includes: a third transistor whose drain is connected to the one of the nodes, whose source is connected to a precharge power supply line of the nodes, and whose gate is connected to an activation signal line to which a precharge activation signal is input; a fourth transistor whose drain is connected to the other one of the nodes, whose source is connected to the precharge power supply line of the nodes, and whose gate is connected to the activation signal line to which the precharge activation signal is input; and a fifth transistor whose source and drain, or drain and source, are connected to the nodes, respectively, and whose gate is connected to the activation signal line to which the precharge activation signal is input. The voltage difference amplification circuit includes: a sense amplifier low side amplification circuit, including: a twelfth transistor whose drain is connected to the one of the nodes, whose source is connected to a sense amplifier low side driving line, and whose gate is connected to the other one of the nodes; and a thirteenth transistor whose drain is connected to the other one of the nodes, whose source is connected to the sense amplifier low side driving line, and whose gate is connected to the one of the nodes; and a restore circuit, including: a first coupling capacitor and a second coupling capacitor whose ohe end is connected to a restore driving signal line; a fourteenth transistor whose drain is connected to the one of the nodes, whose source is connected to the other end of the first coupling capacitor, and whose gate is connected to a power supply voltage line; a fifteenth transistor whose drain is connected to the other one of the nodes, whose source is connected to the other end of the second coupling capacitor, and whose gate is connected to the power supply voltage line; a sixteenth transistor whose drain is connected to a sense amplifier high side driving line, whose source is connected to the one of the complementary data lines, and whose gate is connected to the other end of the first coupling capacitor; and a seventeenth transistor whose drain is connected to the sense amplifier high side driving line, whose source is connected to the other one of the complementary data lines, and whose gate is connected to the other end of the second coupling capacitor. Here, the sense amplifier connection circuit includes a tenth transistor and an eleventh transistor for connecting or disconnecting the complementary data lines to or from the nodes.

For example, after a potential difference between the nodes is amplified to a logic level by the voltage difference amplification circuit, the sense amplifier connection circuit electrically connects the complementary data lines to the nodes.

Alternatively, after a potential difference between the nodes is amplified to a logic level by the voltage difference amplification circuit, the sense amplifier connection circuit may electrically connect the complementary data lines to the nodes while bringing a potential of one of the complementary data lines which has a lower potential to a low level and further amplifying a potential of one of the complementary data lines which has a higher potential.

Moreover, it is preferred that the sense amplifier connection circuit electrically connects one of the nodes to one of the complementary data lines, thereafter electrically connecting the other one of the nodes to the other one of the complementary data lines after a potential difference between the nodes is amplified to a logic level by the voltage difference amplification circuit.

Furthermore, it is preferred that there is further provided a booster circuit for boosting a voltage of each of the complementary data lines to a potential which is one half of a power supply voltage of the semiconductor memory device.

BRIEF DESCRIPTION OF THE DRAWINGS

FIG. 17 is a timing chart illustrating the operation of the semiconductor memory device of the fourth embodiment; and FIG. 18 is a timing chart illustrating another operation of the semiconductor memory device of the fourth embodiment.

DETAILED DESCRIPTION OF THE PREFERRED EMBODIMENT

Figure 1:
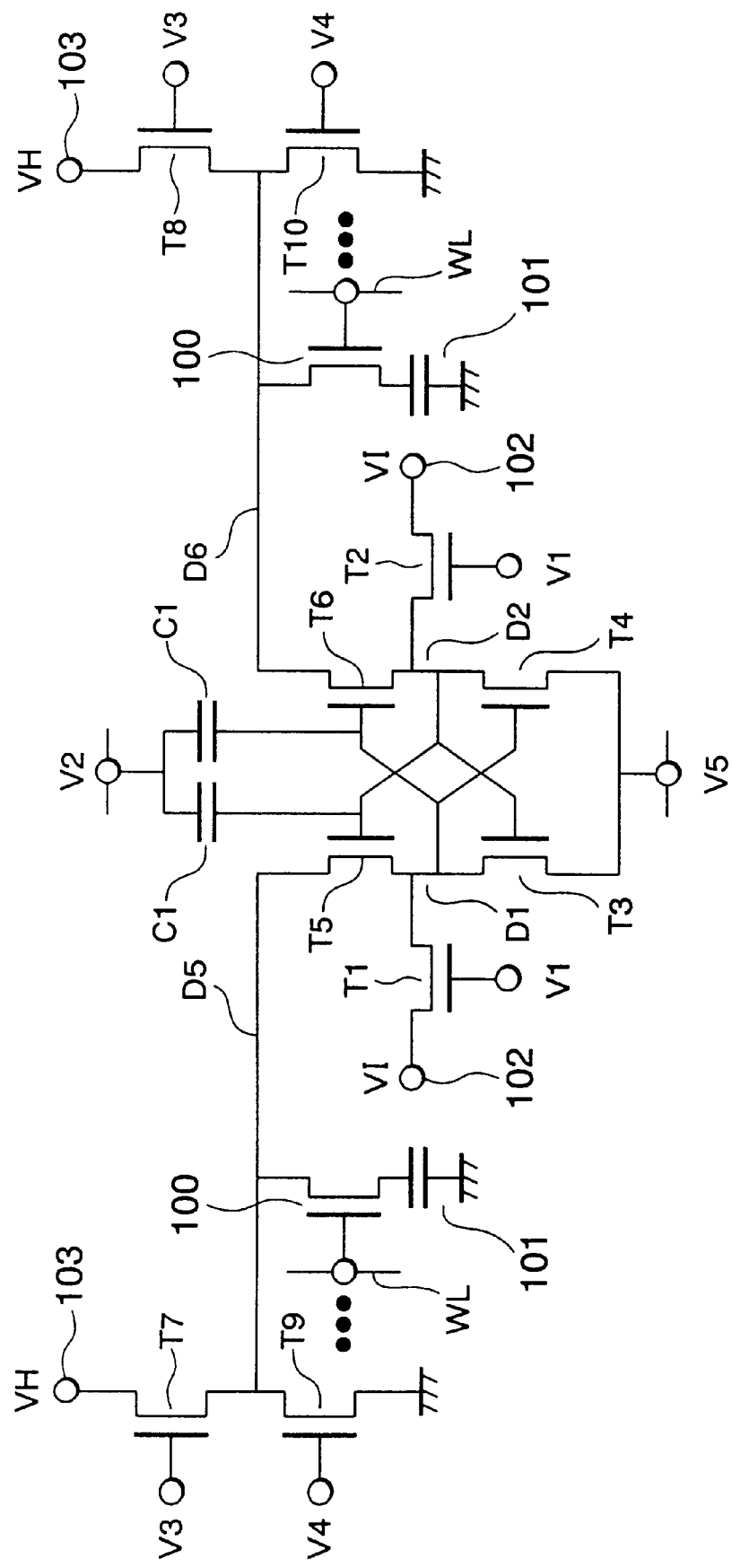
FIG. 1 is a circuit diagram illustrating a sense amplifier circuit of the conventional example 1.
Figure 2:
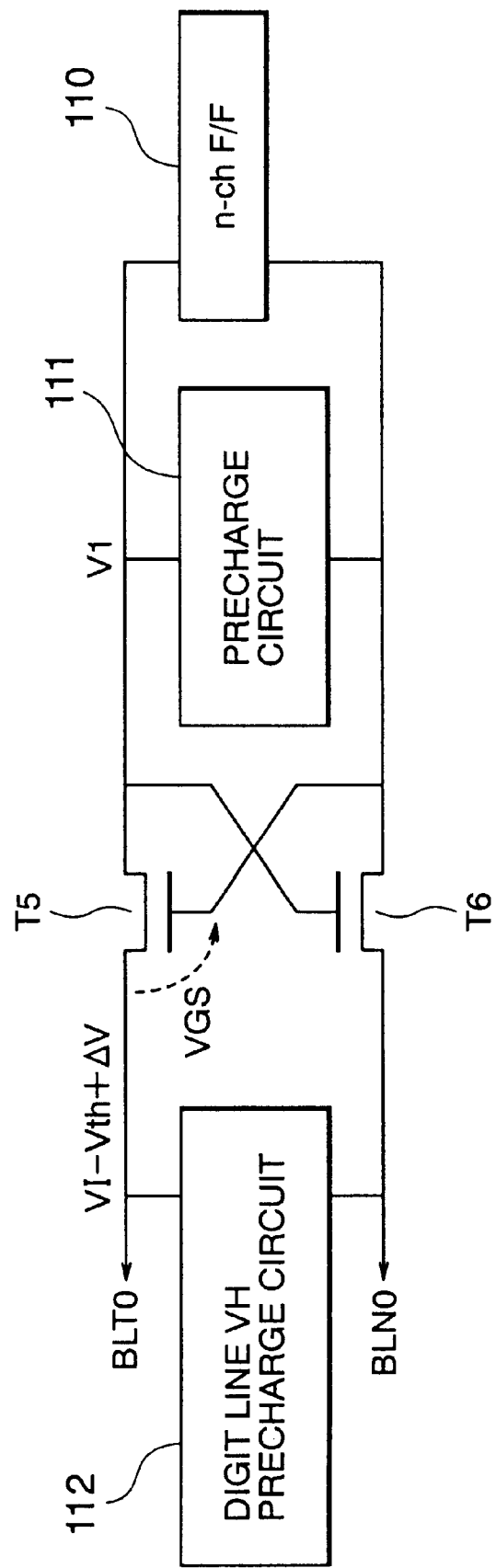
FIG. 2 is a block diagram of FIG. 1.
Figure 3:
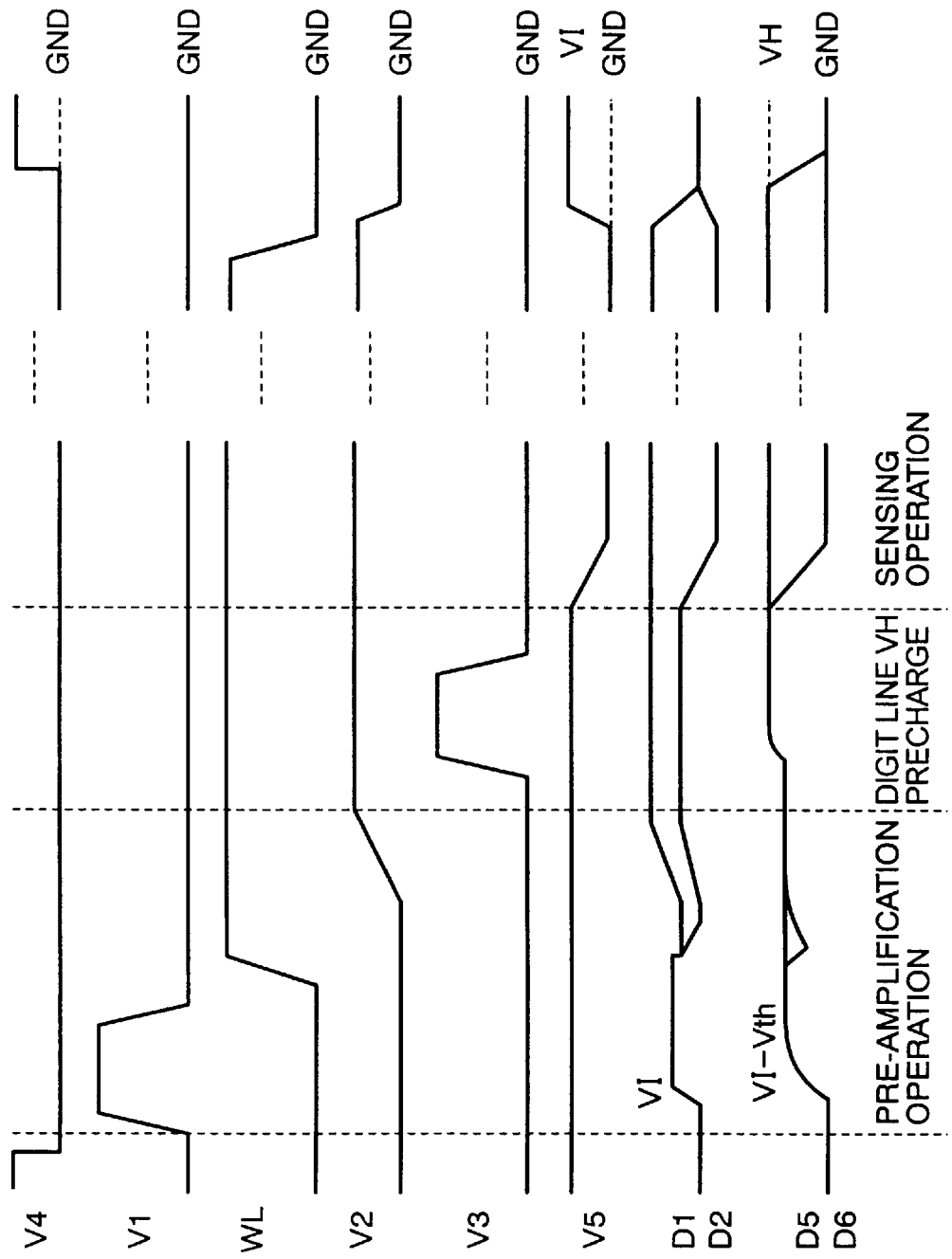
FIG. 3 is a timing diagram illustrating the operation of the sense amplifier circuit of the conventional example 1.
Figure 4:
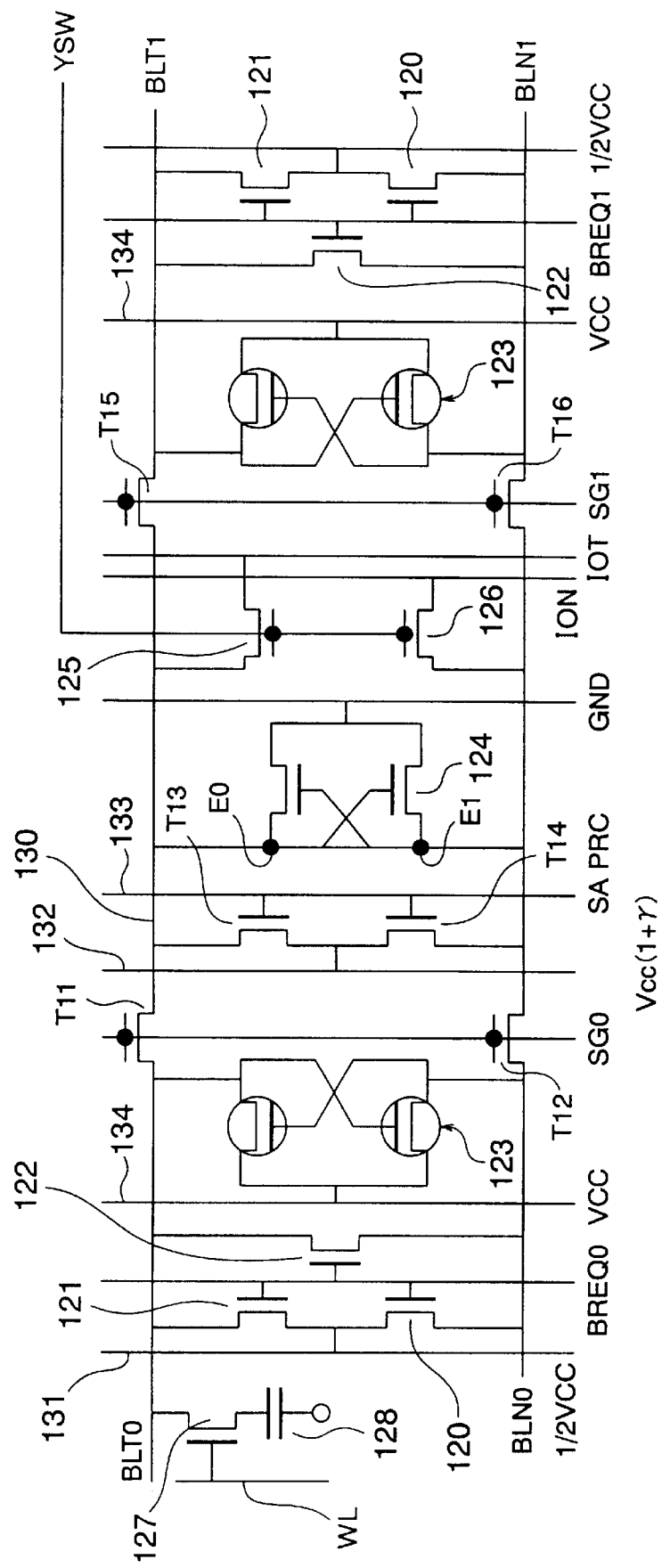
FIG. 4 is a circuit diagram illustrating a sense amplifier circuit of the conventional example 2.
Figure 5:
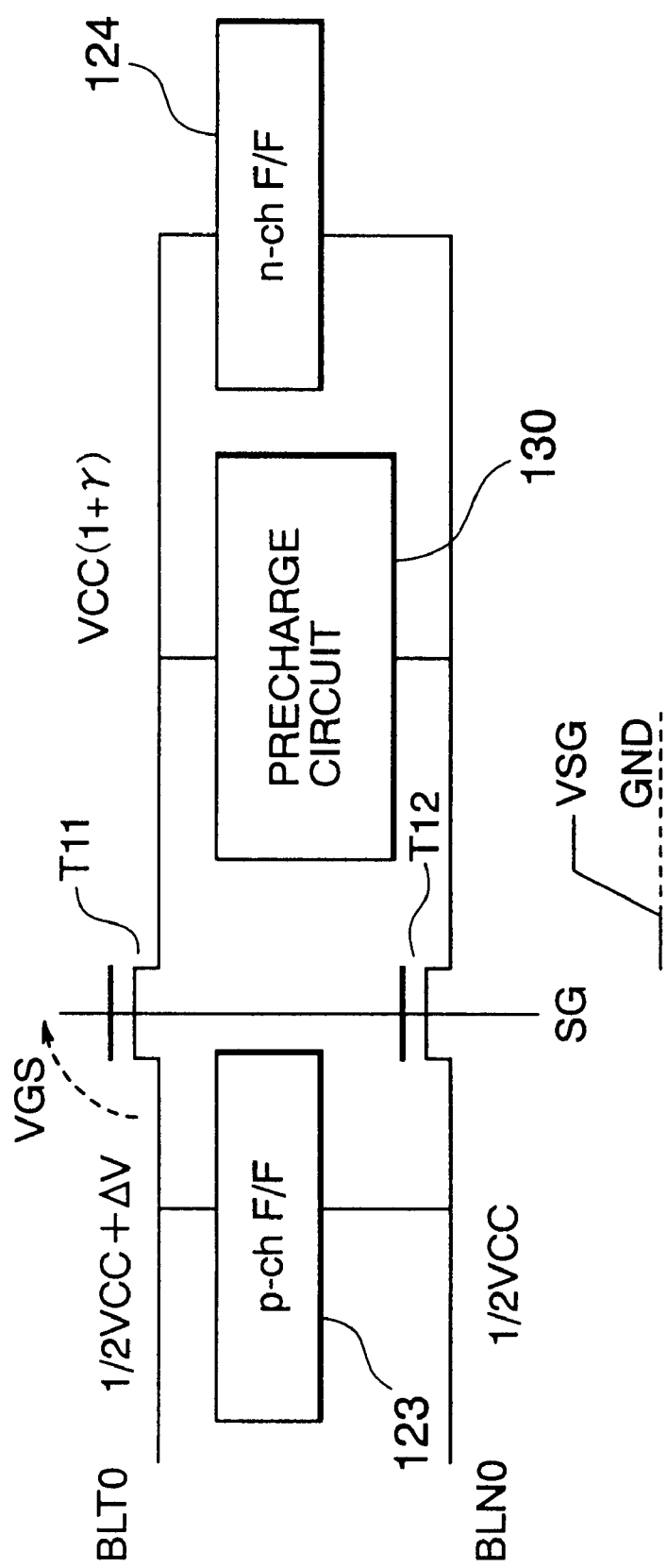
FIG. 5 is a block diagram of FIG. 4.
Figure 6:
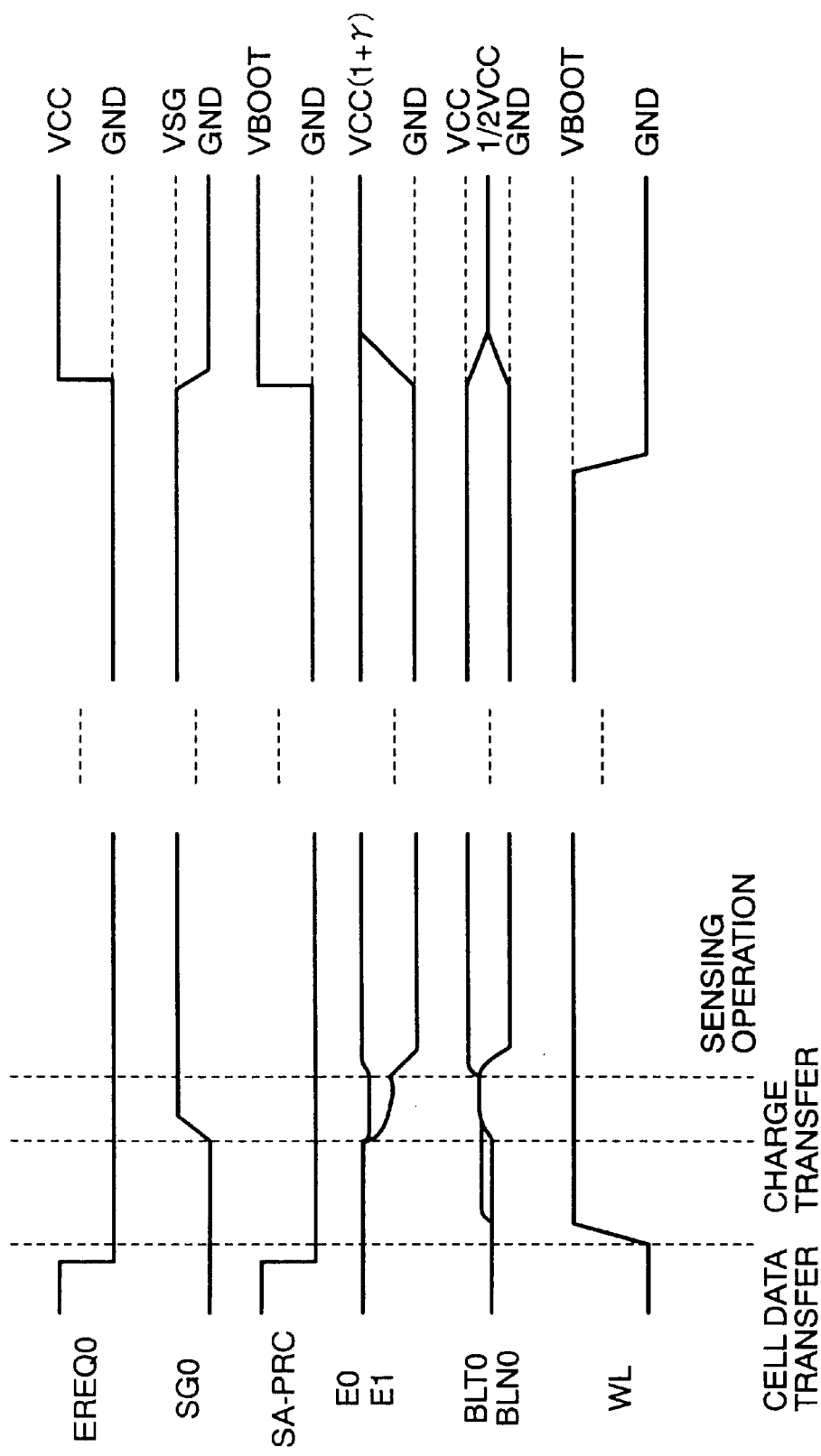
FIG. 6 is a timing chart illustrating the operation of the sense amplifier circuit of the conventional example 2.
Figure 7:
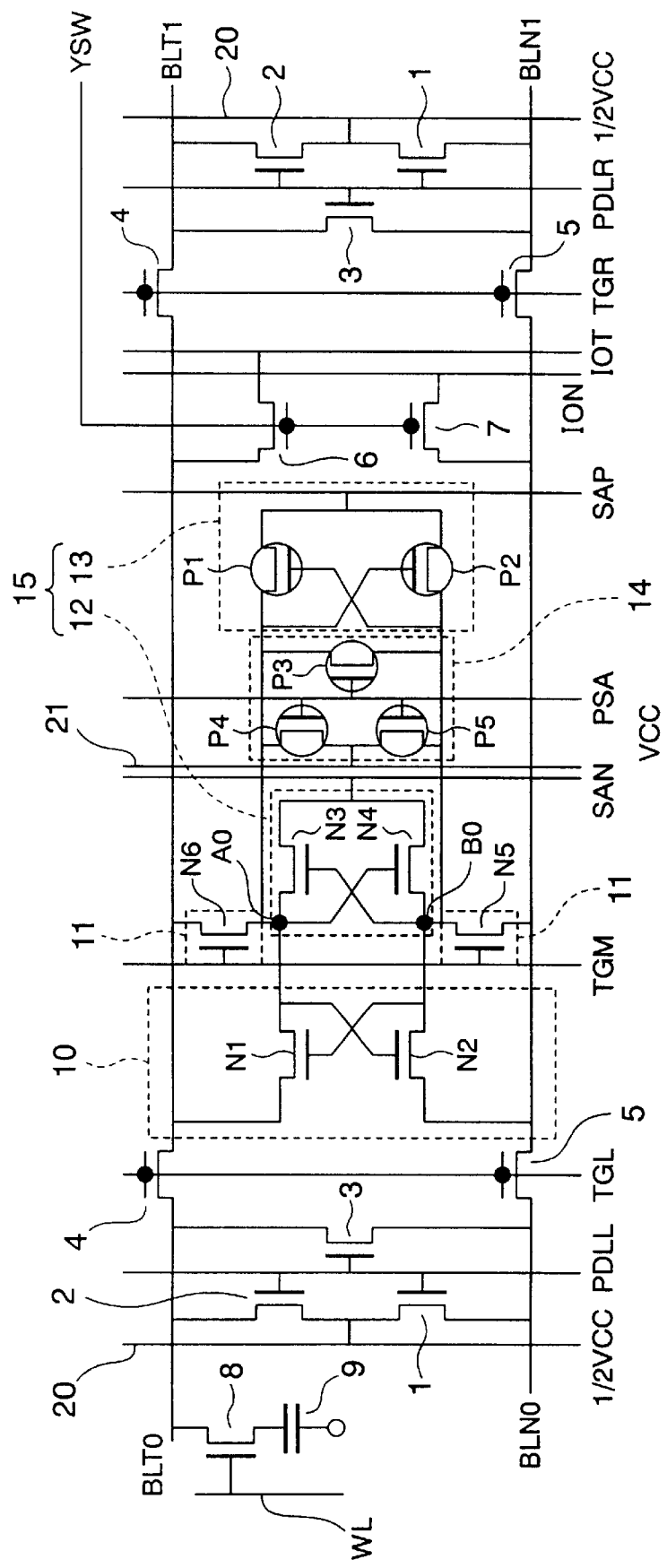
FIG. 7 is a circuit diagram illustrating a semiconductor memory device incorporating a sense amplifier circuit according to a first embodiment of the present invention.
Figure 8:
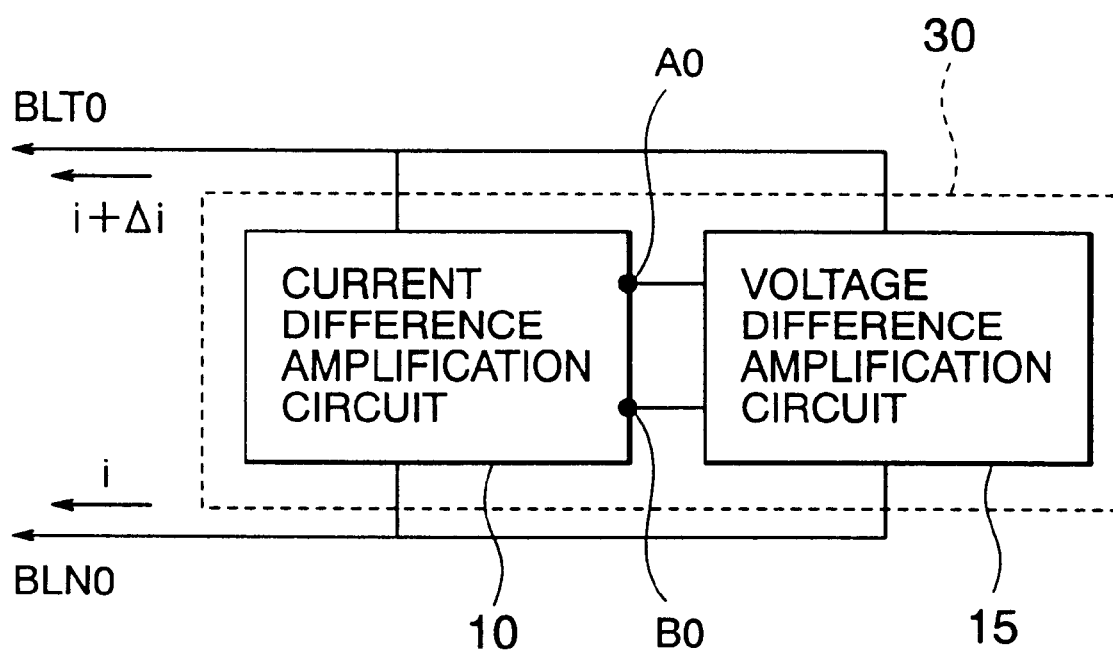
FIG. 8 is a block diagram illustrating the sense amplifier of the first embodiment.
Figure 9:
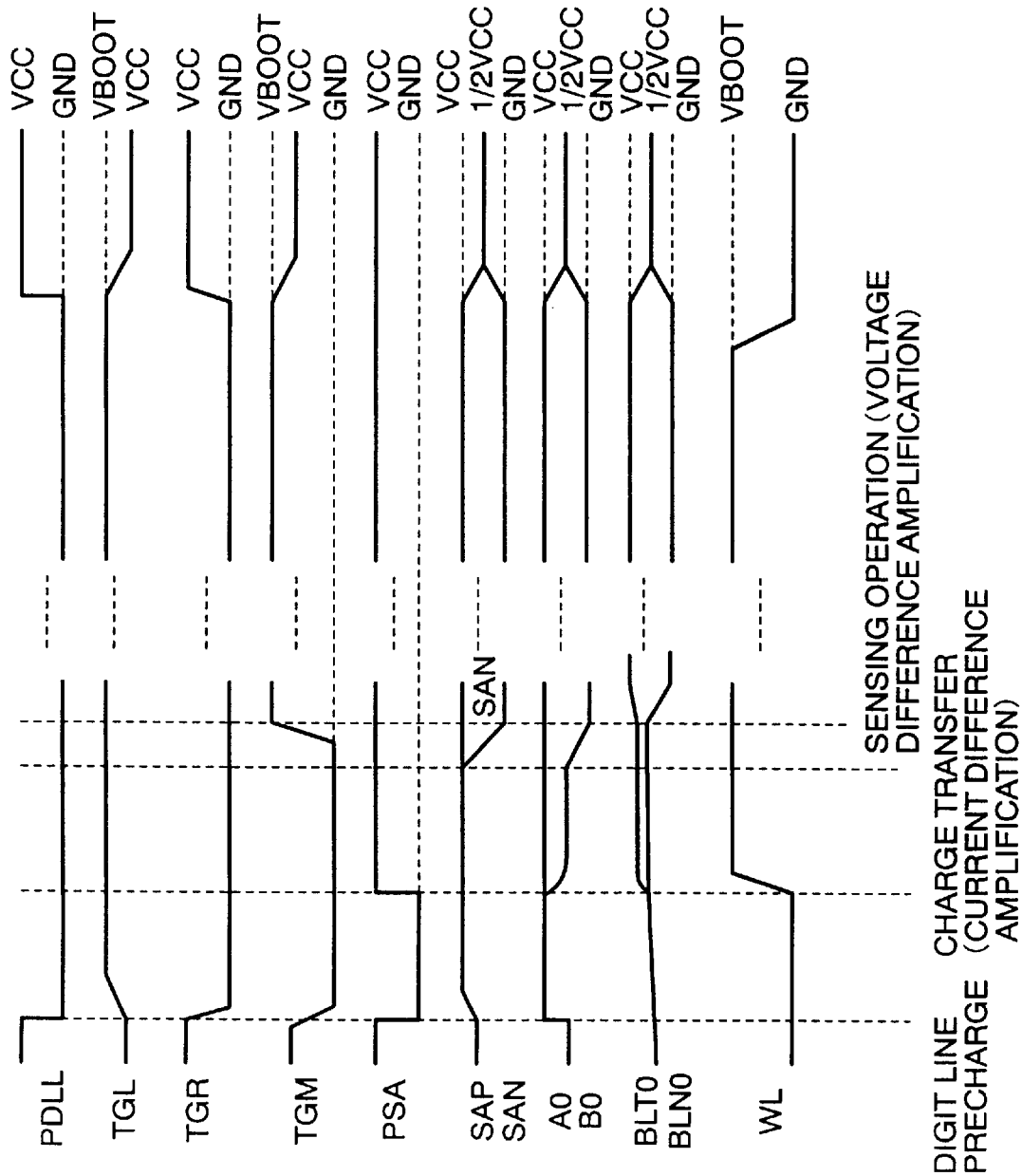
FIG. 9 is a timing chart illustrating the operation of the semiconductor memory device of the first embodiment.

Sense amplifier circuits according to embodiments of the present invention will now be described in detail with reference to the accompanying drawings. FIG. 7 is a circuit diagram illustrating a semiconductor memory device incorporating a sense amplifier circuit according to the first embodiment of the present invention, FIG. 8 is a block diagram illustrating the sense amplifier of the first embodiment, and FIG. 9 is a timing chart illustrating the operation of the semiconductor memory device of the present embodiment.

In the present embodiment, a memory cell including one transistor 8 and one capacitor 9 is connected to a digit line BLT0. A word line WL is connected to the gate of the transistor 8. A digit line BLN0 which is opposing and complementary to the digit line BLT0 is provided. As the digit line BLT0, the digit line BLN0 is provided with a memory cell (not shown). A digit line BLT1 which extends collinearly with the digit line BLT0 is provided. A digit line BLN1 which is opposing and complementary to the digit line BLT1 is provided. Data transfer lines IOT and ION are provided between the digit lines BLT0 and BLT0. The data transfer line IOT and the digit line BLT0 are connected to each other via a transistor 6, and the data transfer line ION and the digit line BLN0 are connected to each other via a transistor 7. A column selection line YSW is connected to the gates of the transistors 6 and 7.

A transistor 4 is connected to the digit line BLT0, and a transistor 5 is connected to the digit line BLN0. A digit line connection signal line TGL is connected to the gates of the transistors 4 and 5. Similarly, the digit line BLT1 and the digit line BLN1 are provided with transistors 4 and 5, respectively, and a digit line connection signal line TGR is connected to the gates of the transistors 4 and 5.

In a place adjacent to the memory cell, the sources of transistors 1 and 2 are connected to the digit line BLT0 and the digit line BLN0, respectively, and a transistor 3 is connected to the digit lines BLT0 and BLN0 adjacent to the transistors 1 and 2. A digit line precharge signal line PDLL is connected to the gates of the transistors 1, 2 and 3. A precharge line 20 whose potential is ½ Vcc is connected to the transistors 1 and 2.

Moreover, a sense amplifier circuit including a current difference amplification circuit 10 and a voltage difference amplification circuit 15 is provided between the digit line BLT0 and the digit line BLN0, and the sense amplifier circuit is provided with sense amplifier complementary nodes A0 and B0 for amplifying a potential. The current difference amplification circuit 10 includes transistors N1 and N2. In the current difference amplification circuit 10, the source of the transistor N1 is connected to the digit line BLT0, the drain thereof is connected to the sense amplifier complementary node A0, and the gate thereof is connected to the sense amplifier complementary node B0. Similarly, the source of the transistor N2 is connected to the digit line BLN0, the drain thereof is connected to the sense amplifier complementary node B0, and the gate thereof is connected to the sense amplifier complementary node A0.

An n-channel flip flop 12 (sense amplifier low side amplification circuit) including transistors N3 and N4 is provided adjacent to the current difference amplification circuit 10. In the flip flop 12, the drain of the transistor N3 is connected to the node A0, the source thereof is connected to a sense amplifier low side driving line SAN, and the gate thereof is connected to the node B0. Similarly, the drain of the transistor N4 is connected to the node B0, the source thereof is connected to the sense amplifier low side driving line SAN, and the gate thereof is connected to the node A0. Thus, the n-channel flip flop 12 is connected to the current difference amplification circuit 10. The flip flop 12 is connected to the digit lines BLT0 and BLN0 via the nodes A0 and B0, and the sense amplifier connection circuits 11, respectively. Each sense amplifier connection circuit 11 includes transistors N5 and N6. A sense amplifier connection signal line TGM is connected to the gate of each of the transistors N5 and N6. When the potential of the sense amplifier connection signal line TGM transitions to the high level, the nodes A0 and B0 are electrically connected to the digit lines BLT0 and BLN1 via the sense amplifier connection circuits 11, respectively.

A precharge circuit 14 is provided adjacent to the flip flop 12. The precharge circuit 14 includes three transistors P3, P4 and P5. The drain of the transistor P4 is connected to the node A0, the source thereof is connected to a power supply voltage line 21, and the gate thereof is connected to a sense amplifier precharge signal line PSA. The drain of the transistor P5 is connected to the node B0, the source thereof is connected to the power supply voltage line 21, and the gate thereof is connected to the sense amplifier precharge signal line PSA. The source and the drain, or the drain and the source, of the transistor P3 are connected to the nodes A0 and B0, respectively, and the gate thereof is connected to the sense amplifier precharge signal line PSA.

A p-channel flip flop 13 (sense amplifier high side amplification circuit) is provided adjacent to the precharge circuit 14. The flip flop 13 includes transistors P1 and P2. The drain of the transistor P1 is connected to the node A0, the source thereof is connected to a sense amplifier high side driving line SAP, and the gate thereof is connected to the node B0. Similarly, the drain of the transistor P2 is connected to the node B0, the source thereof is connected to the sense amplifier high side driving line SAP, and the gate thereof is connected to the node A0. The n-channel flip flop 12 and the p-channel flip flop 13 together form the voltage difference amplification circuit 15.

As illustrated in FIG. 8 which shows the present embodiment in a simplified form, a sense amplifier circuit 30 including the current difference amplification circuit 10 and the voltage difference amplification circuit 15 is provided between the digit lines BLT0 and BLN0.

Next, the operation of the present embodiment will be described. At the beginning of the operation, the potential of the digit line precharge signal line PDLL is brought to the low level (GND level) so as to stop a digit line precharging operation. The potential of each of the sense amplifier high side driving line SAP and the sense amplifier low side driving line SAN is brought to the Vcc level, the potential of the digit line connection signal line TGR is brought to the low level (GND level), and the potential of the digit line connection signal line TGL is brought to the boosted potential (hereinafter referred to as "VBOOT") level. The potential of the sense amplifier connection signal line TGM is brought to the low level (GND level) to turn OFF the transistors N5 and N6, and the potential of the sense amplifier precharge signal line PSA is brought to the low level (GND level) to turn ON the transistors P3, P4 and P5, whereby a current equally flows into the digit lines BLT0 and BLN0 via the transistors N1 and N2, respectively.

Next, the potential of the word line WL is brought to the high level (VBOOT level), while the potential of the sense amplifier precharge signal line PSA is brought to the high level (Vcc level), thereby turning OFF the precharge circuit 14, and then data is transferred from the memory cell to the digit lines BLT0 and BLN0. At this time, the current flowing along the digit lines BLT0 and BLN0 has a very small value. Therefore, even if this period overlaps to some extent with the period in which the potential of the word line WL is brought to the high level and the potential of the sense amplifier precharge signal line PSA is brought to the low level, thereby turning ON the precharge circuit 14, the current value is so small that the data of the memory cell is not immediately erased.

Then, the data from the memory cell causes a potential difference between the digit lines BLT0 and BLN0, thereby causing a slight difference between the current flowing from the node A0 to the digit line BLT0 and the current flowing from the node B0 to the digit line BLN0. The current difference amplification circuit 10 causes a large voltage difference between the nodes A0 and B0 by using the slight current difference.

For example, when the digit line BLN0 is at the low level, the current flowing from the node B0 to the digit line BLN0 is greater than the current flowing from the node A0 to the digit line BLT0. Thus, the potential of the node B0 gradually decreases in proportion to the amount of charge withdrawn therefrom. The effect of decreasing the potential of the node B0 is more pronounced as the ratio of the capacitance of the digit line with respect to the capacitance of the sense amplifier nodes A0 and B0 is greater. As the potential of the node B0 decreases, the amount of current flowing through the transistor N1, whose gate is receiving the potential of the node B0, gradually decreases. Eventually, the potential of the node A0 no longer substantially decreases. Similarly, when the digit line BLT0 is at the low level, as the potential of the node A0 decreases, the amount of current flowing through the transistor N2, whose gate is receiving the potential of the node A0, gradually decreases. Eventually, the potential of the node B0 no longer substantially decreases. In this way, a slight current difference is converted into a potential difference. Thus, a data amplified signal can be obtained.

After a large potential difference (data amplified signal) occurs between the nodes A0 and B0, as described above, the potential of the sense amplifier low side driving line SAN is brought to the GND level, and the potential of the sense amplifier high side driving line SAP is brought to Vcc, thereby turning ON the transistors N3 and N4 and the transistors P1 and P2, thus activating the n-channel flip flop 12 and the p-channel flip flop 13 of the voltage difference amplification circuit 15. Thus, the potential difference between the nodes A0 and B0 is amplified to a logic level. The phrase "to amplify a potential difference to a logic level" as used herein means to increase the potential difference between the nodes A0 and B0 to such a level that the potential of each of the nodes A0 and B0 can be determined to be high or low. In this case, the potential of the node A0 on the high side is brought to Vcc, and the potential of the node B0 on the low side is brought to GND.

Thereafter, the potential of the sense amplifier connection signal line TGM is brought to the high level (VBOOT level), thereby turning ON the transistors N5 and N6, connecting the voltage difference amplification circuit 15 to the digit lines BLT0 and BLN0 via the sense amplifier connection circuit 11, and bringing the potential of the high side digit line BLT0 to Vcc and the potential of the low side digit line BLN0 to GND. Thus, when the sensing operation has been completed and the potential of the digit lines BLT0 and BLN0 has been brought to a sufficiently high or low level, data is written back to the digit lines BLT0 and BLN0.

At the end of the operation, the potential of the word line WL is brought to the low level, the potentials of the sense. amplifier high side driving line SAP and the sense amplifier low side driving line SAN to ½ Vcc, and the potentials of the sense amplifier connection signal line TGM and the digit line connection signal lines TGL and TGR to the Vcc level, thereby precharging the respective sections to a potential of ½ Vcc.

In the sense amplifier of the present embodiment, even if the transistor threshold voltage Vth of the transistors N1 and N2 of the current difference amplification circuit 10 varies, thereby causing a potential difference according to the variations in the threshold voltage Vth between the digit lines BLT0 and BLN0, the potential of the word line WL can be raised after the currents flowing from the transistors N1 and N2 are adjusted to substantially the same level, i.e., after the respective VGS-Vth levels of the transistors N1 and N2 are adjusted to substantially the same potential level. Thus, it is possible to reduce the influence of the variations in the threshold voltage Vth.

Moreover, in the flip flops 12 and 13, even if variations occur in the threshold voltage Vth of the transistors N3 and N4 and the transistors P1 and P2, a sufficient sensing margin can be ensured because a large potential difference is provided between the nodes A0 and B0 by the pre-amplification operation. Furthermore, if the values of the currents flowing from the transistors N1 and N2 are aligned with each other, there is no particular need to charge the digit lines BLT0 and BLN0 to a potential level in the vicinity of Vcc-Vth. Thus, it is possible to reduce the amount of time required for the pre-amplification operation by the current difference amplification circuit 10.

Thus, in the present embodiment, it is not necessary to operate a transistor with a voltage in the vicinity of the threshold voltage thereof, and the data amplification operation is started in the current difference amplification circuit 10 by a minute difference between the currents which flow from the current difference amplification circuit 10 to the complementary digit lines BLT0 and BLN0 with respect to the digit signal amounts occurring along the digit lines BLT0 and BLN0. Then, the data amplified signal obtained in the current difference amplification circuit 10 can be further amplified to a logic level by the voltage difference amplification circuit 15 so as to write high level or low level data to the digit lines BLT0 and BLN0.

Figure 10:
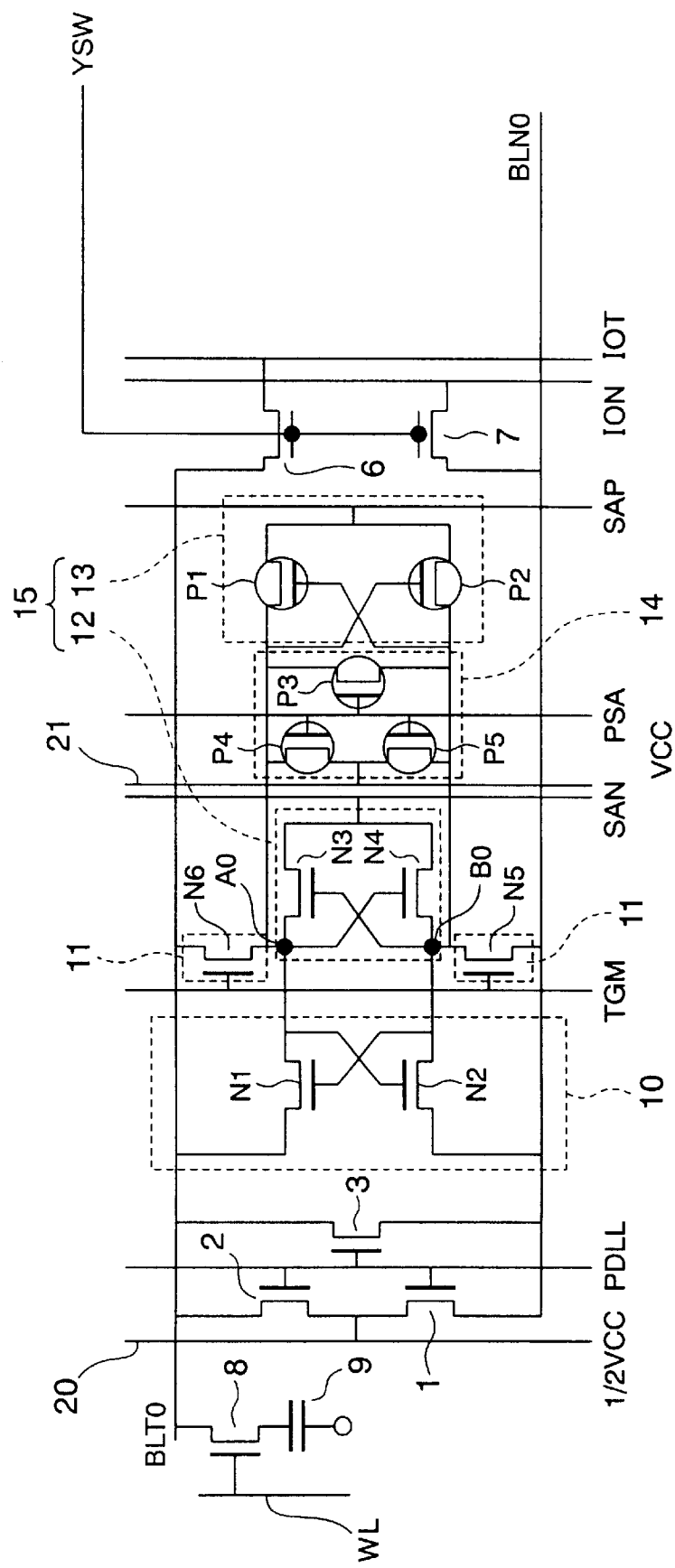
FIG. 10 is a circuit diagram illustrating a semiconductor memory device incorporating a sense amplifier circuit according to a second embodiment of the present invention.
Figure 11:
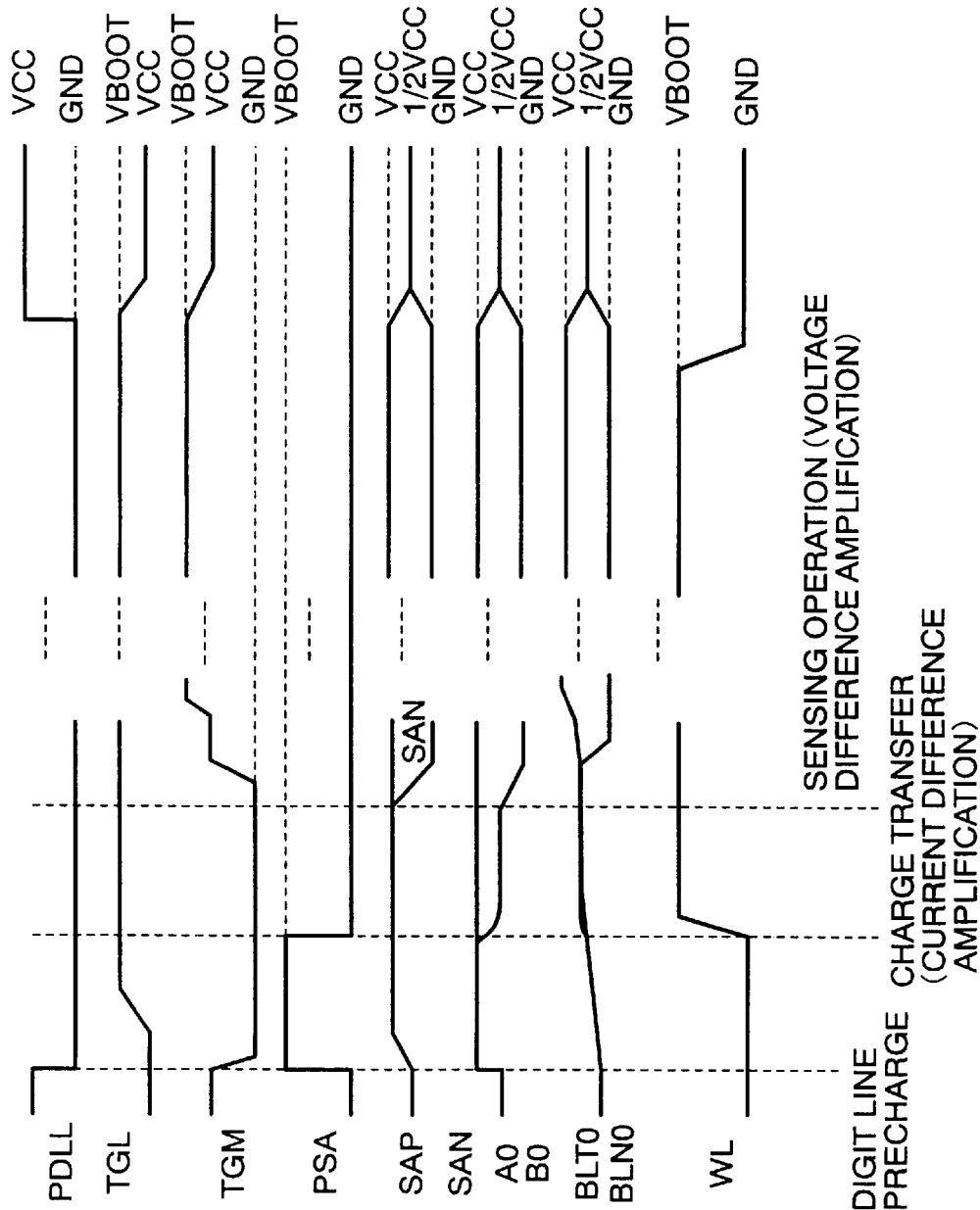
FIG. 11 is a timing chart illustrating the operation of the semiconductor memory device of the second embodiment.

Next, the second embodiment of the present invention will be described. FIG. 10 is a circuit diagram illustrating a semiconductor memory device incorporating a sense amplifier circuit according to the second embodiment of the present invention, and FIG. 11 is a timing chart illustrating the operation of the semiconductor memory device of the present embodiment. Each element that is already illustrated in the first embodiment with reference to FIG. 7 to FIG. 9 will be denoted by the same reference numeral, and will not be further described below.

The present embodiment is an application of the first embodiment to an open type digit line. The present embodiment is structurally similar to the first embodiment except that the digit lines BLT1 and BLN1 and the digit line connection signal lines TGL and TGR are not provided, whereby the transistors 4 and 5 are not provided accordingly, and the transistors 1, 2 and 3 between the digit lines BLT1 and BLN1 are not provided.

Next, the operation of the present embodiment will be described. The operation up to sense-amplifying the potential difference between the nodes A0 and B0 is the same as that described above in the first embodiment, and thus will not be described below. Thereafter, as illustrated in FIG. 11, in the present embodiment, the potential of the sense amplifier connection signal line TGM is brought up to Vcc, and the charge of the low side line of the digit lines BLT0 and BLN0 is withdrawn, after which the potential of the sense amplifier connection signal line TGM is brought to the VBOOT level so as to perform an amplification operation of the high side line of the digit lines BLT0 and BLN0. Thus, the potential difference between the digit lines BLT0 and BLN0 is increased, whereby each of the digit lines BLT0 and BLN0 is brought to the high level or the low level. Then, the operation is terminated as in the first embodiment.

In the present embodiment, the potential of the high side line of the digit lines BLT0 and BLN0 is charged after the potential of the low side line of the digit lines BLT0 and BLN0 is fixed to a potential in the vicinity of the GND level. In other words, after the potential of either one of the digit lines BLT0 and BLN0 is fixed, data of the other one of the digit lines BLT0 and BLN0 is amplified. Therefore, it is possible to reduce the current leaking from the sense amplifier high side driving line SAP to the sense amplifier low side driving line SAN which occurs at a digit line intermediate potential when the sensing operation is started, i.e., to reduce the through current in the sense amplifier circuit. Thus, it is possible to reduce the amount of current consumed during the sensing operation and to reduce the amount of data signal of the digit lines BLT0 and BLN0 to be lost due to variations in the threshold voltage Vth of the transistors in the sense amplifier circuit.

Alternatively, in the present embodiment, the potential of the low side line of the digit lines BLT0 and BLN0 is fixed after fixing the potential of the high side line of the digit lines BLT0 and BLN0.

Figure 12:
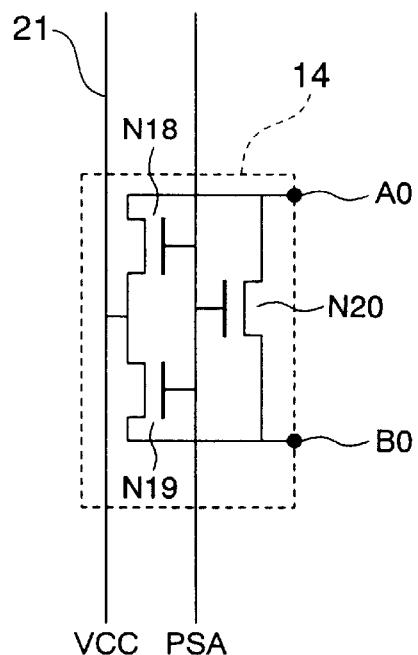
FIG. 12 is a circuit diagram illustrating a variation of a precharge circuit of the sense amplifier circuit according to the first embodiment of the present invention.

FIG. 12 is a circuit diagram illustrating a variation of the precharge circuit of the sense amplifier circuit according to the first embodiment of the present invention. In the first embodiment described above, the precharge circuit 14 may alternatively be provided by using n-channel transistors N18, N19 and N20 instead of using the p-channel transistors P3, P4 and P5. The basic operation of such an alternative circuit is the same as that of the first embodiment, except that the former is operated by a reverse phase potential signal, i.e., the former is operated with the potential of the sense amplifier precharge signal line PSA being at the low level (GND), not the high level (VBOOT).

Figure 13:
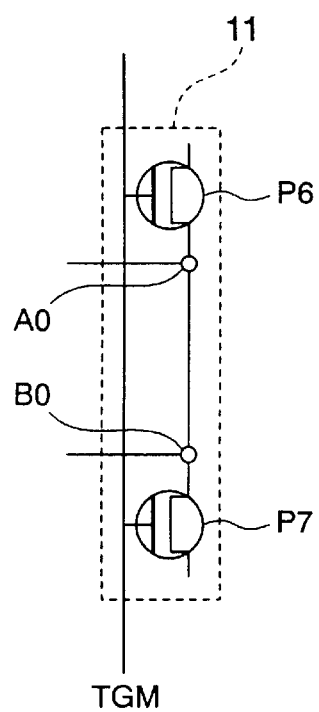
FIG. 13 is a circuit diagram illustrating a variation of a sense amplifier connection circuit of the sense amplifier circuit according to the first embodiment of the present invention.

FIG. 13 is a circuit diagram illustrating a variation of the sense amplifier connection circuit of the sense amplifier circuit according to the first embodiment of the present invention. In the first embodiment described above, the sense amplifier connection circuit 11 may alternatively be provided by using p-channel transistors P6 and P7 instead of using the n-channel transistors N5 and N6. The basic operation of such an alternative circuit is the same as that of the first embodiment, except that the former is operated by a reverse phase potential signal, i.e., the former is operated with the potential of the sense amplifier connection signal line TGM being at the low level (VNB), not the high level (Vcc). The designation "VNB" refers to a negative voltage by which the p-channel transistors P6 and P7 can be turned ON with the GND level.

The sense amplifier connection circuit 11 illustrated in FIG. 13 may be applied to the second embodiment. Again, the basic operation of such an alternative circuit is the same as that of the second embodiment except that the potential of the sense amplifier connection signal line TGM is temporarily brought to the Vcc level in the second embodiment, whereas in such an alternative circuit, the potential of the sense amplifier connection signal line TGM is temporarily brought to the GND level so as to sufficiently charge the high side line of the digit lines BLT0 and BLN0, thereby fixing the potential of the high side line, after which the potential of the sense amplifier connection signal line TGM is pulled down to VNB. Thus, according to the variation, the potential of the sense amplifier connection signal line TGM can be temporarily brought to the GND level, whereby it is possible to reduce the amount of current consumed at the start of the sensing operation.

Figure 14:
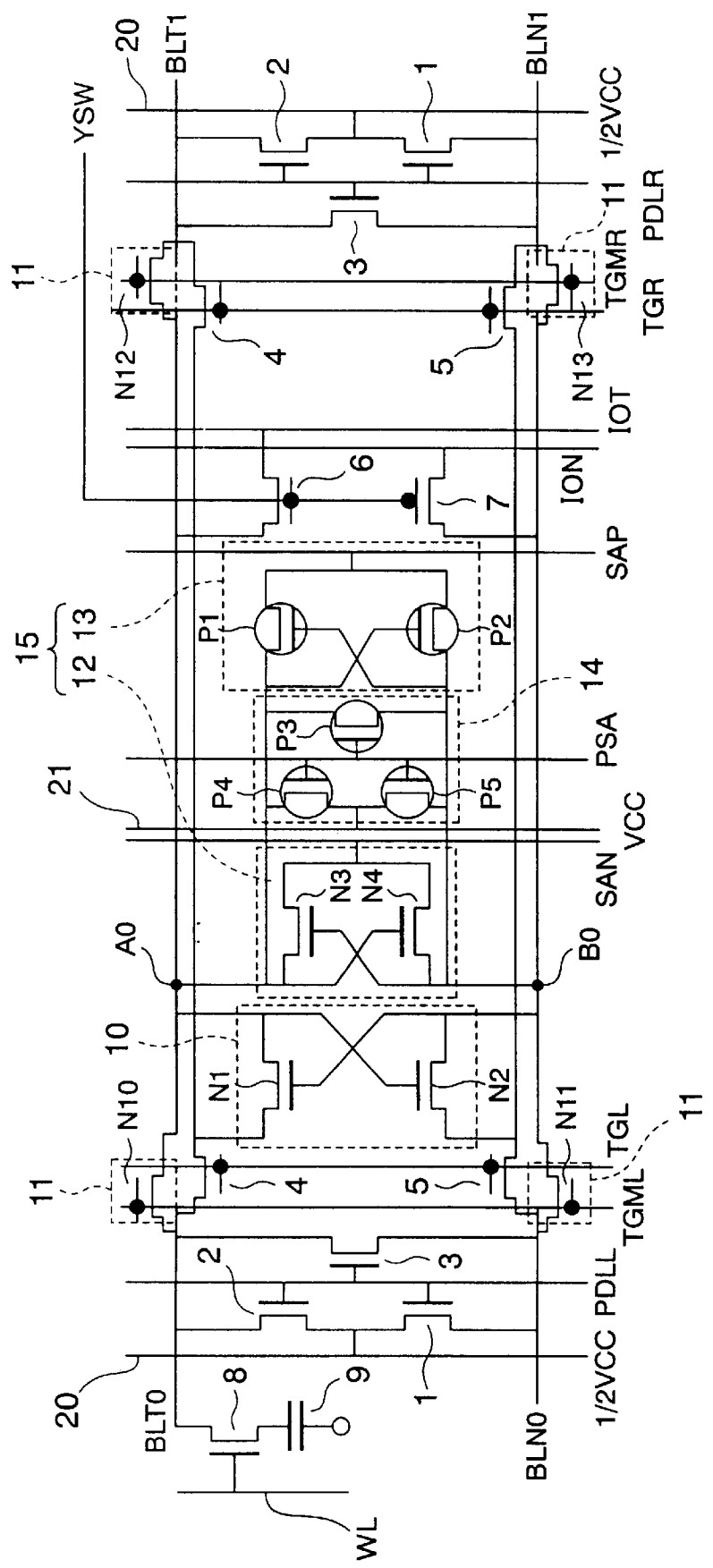
FIG. 14 is a circuit diagram illustrating a semiconductor memory device incorporating a sense amplifier circuit according to a third embodiment of the present invention.
Figure 15:
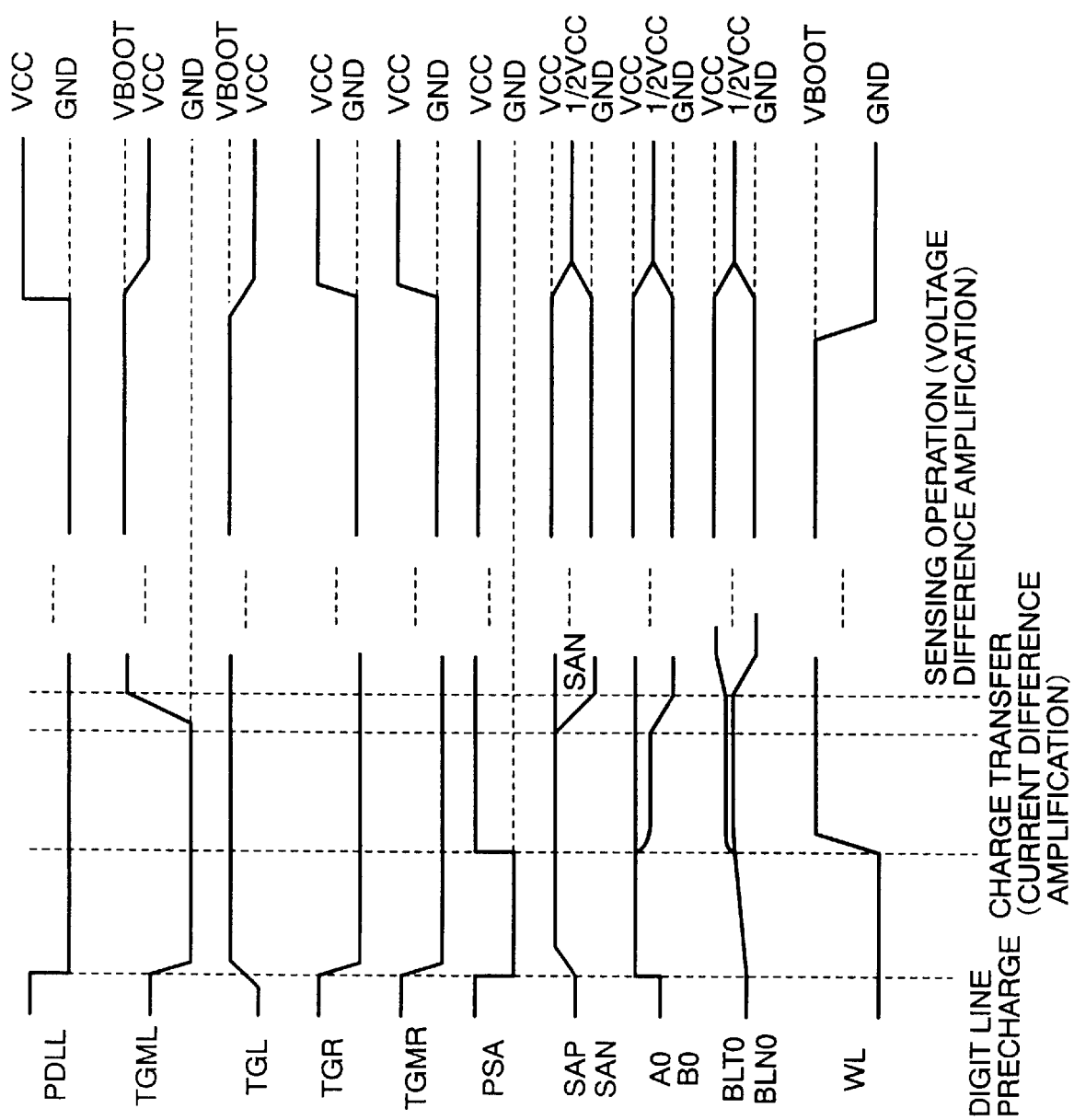
FIG. 15 is a timing chart illustrating the operation of the semiconductor memory device of the third embodiment.

Next, the third embodiment of the present invention will be described. FIG. 14 is a circuit diagram illustrating a semiconductor memory device incorporating a sense amplifier circuit according to the third embodiment of the present invention, and FIG. 15 is a timing chart illustrating the operation of the semiconductor memory device of the present embodiment. Each element that is already illustrated in the first embodiment with reference to FIG. 7 to FIG. 9 will be denoted by the same reference numeral, and will not be further described below.

The present embodiment is structurally similar to the first embodiment except that the configuration of the sense amplifier connection circuit 11 is different from that of the first embodiment. The sense amplifier connection circuit 11 of the present embodiment includes n-channel transistors N10, N11, N12 and N13. A sense. amplifier connection signal line TGML is connected to the gates of the transistors N10 and N11, and a sense amplifier connection signal line TGMR is connected to the gates of the transistors N12 and N13.

The basic operation of the present embodiment is the same as that of the first embodiment. However, in the first embodiment, the operation of writing data from the voltage difference amplification circuit 15 to the digit lines BLT0 and BLN0 is performed by bringing the potentials of the sense amplifier connection signal lines TGMR and TGML and the digit line connection signal lines TGL and TGR to the high level, thereby turning ON the transistors N5 and N6 and the transistors 4 and 5, i.e., the data write operation is performed via two stages transfer gate. In contrast, in the present embodiment, as the transfer gate, in addition to the transistors 4 and 5 controlled by the potentials of the digit line connection signal lines TGL and TGR, another transfer gate, which is the sense amplifier connection circuit 11 controlled by the potential of the sense amplifier connection signal line TGML, is provided, whereby the operation of writing data from the voltage difference amplification circuit 15 to the digit lines BLT0 and BLN0 can be performed via only a single stage of transfer gate. In this way, the speed of the data writing operation can be further increased.

Next, the operation of the present embodiment will be described. The operation up to sensing/amplifying the nodes A0 and B0 is the same as that described above in the first embodiment, and thus will not be described below. Thereafter, in the present embodiment, the potential of the sense amplifier connection signal line TGML is brought to the VBOOT level so as to perform an amplification operation for the high side line of the digit lines BLT0 and BLN0, as illustrated in FIG. 15. Thus, the potential of each of the digit lines BLT0 and BLN0 is amplified to the high level or low level potential. The operation is terminated as in the first embodiment. Moreover, the precharge circuit 14 may be replaced by the alternative precharge circuit 14 illustrated in FIG. 12.

Figure 16:
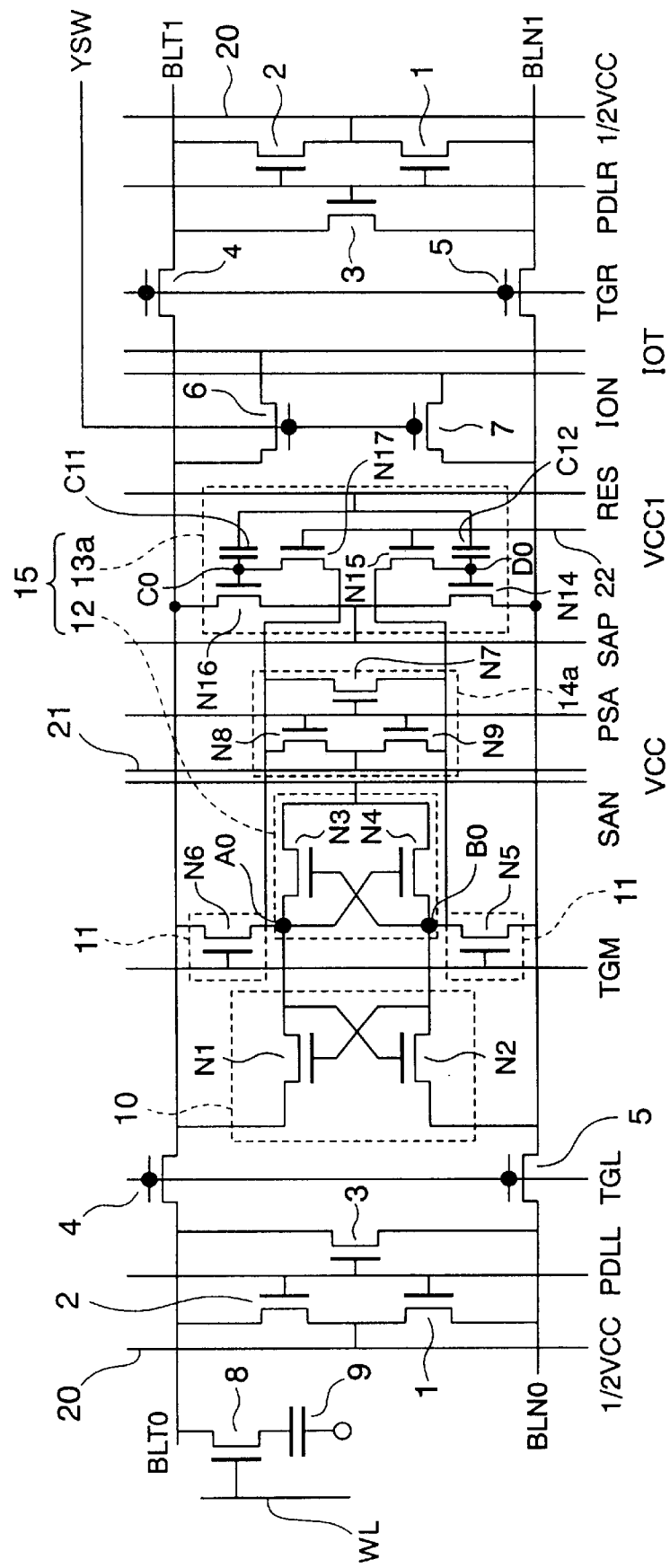
FIG. 16 is a circuit diagram illustrating a semiconductor memory device incorporating a sense amplifier circuit according to a fourth embodiment of the present invention.

Next, the fourth embodiment of the present invention will be described. FIG. 16 is a circuit diagram illustrating a semiconductor memory device incorporating a sense amplifier circuit according to the fourth embodiment of the present invention, and FIG. 17 is a timing chart illustrating the operation of the semiconductor memory device of the present embodiment. Each element that is already illustrated in the first embodiment with reference to FIG. 7 to FIG. 9 will be denoted by the same reference numeral, and will not be further described below.

The present embodiment is structurally similar to the first embodiment except that: the voltage difference amplification circuit 15 has a restore circuit 13a including nodes C0 and D0 and n-channel transistors N14, N15, N16 and N17 and capacitors C11 and C12, instead of the p-channel flip flop 13 of the first embodiment shown in FIG. 7. And a precharge circuit 14a is provided including n-channel transistors N7, N8 and N9.

In the restore circuit 13a, one end of each of the capacitors C11 and C12 (coupling capacitors) is connected to a pull-up driving signal line RES (restore driving signal line). The gate of the transistor N16 is connected to the other end of the capacitor C11, the source thereof is connected to the digit line BLT0, and the drain thereof is connected to the sense amplifier high side driving line SAP. Similarly, the gate of the transistor N14 is connected to the other end of the capacitor C12, the source thereof is connected to the digit line BLN0, and the drain thereof is connected to the sense amplifier high side driving line SAP. Moreover, the node C0 is provided between the capacitor C11 and the transistor N16, and the node D0 is provided between the capacitor C12 and the transistor N14.

The source of the transistor N17 is connected to the node C0, the drain thereof is connected to the node A0, and the gate thereof is connected to a power supply voltage line 22. Similarly, the source of the transistor N15 is connected to the node D0, the drain thereof is connected to the node B0, and the gate thereof is connected to the power supply voltage line 22. Vcc1 is applied to the power supply voltage line 22.

Next, the operation of the present embodiment will be described. First, before the operation is started, the potential of each of the nodes A0 and B0 and the digit lines BLT0 and BLN0 is precharged to ½ Vcc, as in the first embodiment. Upon the start of the operation, the potential of the digit line precharge signal line PDLL is brought to the low level (GND level) to stop the digit line precharge operation. Then, the potential of each of the sense amplifier high side driving line SAP and the sense amplifier low side driving line SAN is brought to the Vcc level, the potential of the digit line connection signal line TGR is brought to the low level (GND level), and the potential of the digit line connection signal line TGL is brought to the VBOOT level. The potential of the sense amplifier connection signal line TGM is brought to the low level (GND level), thereby turning OFF the transistors N5 and N6, and the potential of the sense amplifier precharge signal line PSA is brought to the high level (VBOOT level), thereby turning ON the transistors N7, N8 and N9. As a result, a current equally flows to the digit lines BLT0 and BLN0 via the transistors N1 and N2, respectively.

Then, the potential of the word line WL is brought to the high level (VBOOT level), and the potential of the sense amplifier precharge signal line PSA is brought to the low level, thereby turning OFF the precharge circuit 14a, after which data is transferred from the memory cell to the digit lines BLT0 and BLN0. Then, a potential difference occurs between the digit lines BLT0 and BLN0 due to the data from the memory cell, thereby causing a difference between the current flowing from the node A0 to the digit line BLT0 and the current flowing from the node B0 to the digit line BLN0. As described above, the current difference amplification circuit 10 including the transistors N1 and N2 generates a large voltage difference between the nodes A0 and B0 by using the current difference.

After a large potential difference occurs between the nodes A0 and B0, as described above, the potential of the sense amplifier low side driving line SAN is brought to the low level, and the n-channel flip flop 12 of the voltage difference amplification circuit 15 is activated so as to amplify the potential difference between the nodes A0 and B0, thereby bringing the potential of the node A0 to Vcc and the potential of the node B0 to GND. Then, the potentials of the nodes A0 and B0 are transferred to the nodes C0 and D0 via the transistors N17 and N15, respectively.

In this case, the voltage Vcc1 which is input to the gate of each of the transistors N17 and N15 may be a fixed voltage in the range of ½ Vcc+VT≦Vcc1≦Vcc, where VT denotes the threshold voltage of the transistors N17 and N15. When the potential of the node A0 is a voltage slightly lower than Vcc, and the potential of the node B0 is amplified to GND, the potential of the node C0 is about Vcc1-VT, and the potential of the node D0 is at the GND level. Then, the potential of the pull-up driving signal line RES is brought to the high level (Vcc level), thereby pulling up the potential of each of the nodes C0 and D0 via the capacitors C11 and C12, respectively. As a result, the transistor N15 is completely turned ON, and the potential of the node D0 remains fixed at the GND level. On the other hand, the transistor N17 is in a substantially OFF state, whereby the potential of the node C0 reaches to a potential of at least Vcc+VT or more, thereby turning ON the transistor N16. Thus, the operation of charging the digit line BLT0 to the high level is started. In this case, the digit line BLT0 is charged to a sufficiently high level while keeping the potential of the sense amplifier connection signal line TGM at the low level so that the potential of the node C0 does not leak to the digit line BLT0 when the potential of the sense amplifier connection signal line TGM is brought to the high level.

Thereafter, the potential of the sense amplifier connection signal line TGM is brought to the high level (VBOOT level) so as to write data to each of the digit lines BLT0 and BLN0, thereby amplifying each of the digit lines BLT0 and BLN0. At the end of the operation, the potential of the word line WL is brought to the low level, the potential of each of the sense amplifier high side driving line SAP and the sense amplifier low side driving line SAN to ½ Vcc, the potential of each of the sense amplifier connection signal line TGM and the digit line connection signal lines TGL and TGR to the Vcc level, and the potential of the pull-up driving signal line RES to the GND level, thereby precharging the respective sections to a potential of ½ Vcc.

The basic operation of the current difference amplification circuit 10, etc., of the sense amplifier circuit of the present embodiment is the same as that of the first embodiment. However, a significant feature of the present embodiment is that the voltage difference amplification circuit 15 is realized by using only n-channel transistors and capacitors. In other words, in the sense amplifier circuit of the present embodiment, a p-channel transistor is not used, thereby eliminating the need for providing an n-well separation region, and thus allowing for a reduction in the area of the sense amplifier section.

FIG. 18 is a timing diagram illustrating another operation of the semiconductor memory device of the present embodiment. The present embodiment is not limited to the above-described operation. Alternatively, in a manner similar to that of the second embodiment, the potential of the sense amplifier connection signal line TGM may be pulled up to Vcc after the potential of each of the nodes C0 and D0 is fixed, and the digit lines BLT0 and BLN0 may be charged to a sufficiently high level while withdrawing the charge of the low side line of the digit lines BLT0 and BLN0, after which the potential of the sense amplifier connection signal line TGM may be brought to the high level (VBOOT level) so as to amplify the potential of each of the digit lines BLT0 and BLN0.

While the present invention has been described as being applied to a folded type digit line configuration, the present invention can be easily applied to an open type digit line configuration. Moreover, while each of the embodiments described above is directed to an application of the present invention to a sense amplifier of a semiconductor memory device (DRAM), the present invention is not limited thereto, but can alternatively be applied to a data amplification circuit using complementary data lines in general.

What is claimed is:

1. A sense amplifier circuit for amplifying a signal difference between complementary data lines of a semiconductor memory device, comprising:

a current difference amplification circuit for amplifying a potential difference between the complementary data lines by using a difference between respective currents flowing into the complementary data lines which occurs due to the potential difference between the complementary data lines;

a pair of nodes connected to the current difference amplification circuit for outputting the amplified potential difference;

a voltage difference amplification circuit connected to the nodes for amplifying the potential difference between the nodes into a logic level;

a precharge circuit connected to the nodes for causing a current to flow from the current difference amplification circuit to the complementary data lines; and a sense amplifier connection circuit connected to the nodes and the complementary data lines for electrically connecting or disconnecting the nodes to or from the complementary data lines.

2. The sense amplifier circuit according to claim 1, wherein:

the current difference amplification circuit comprises: a first transistor whose source is connected to one of the complementary data lines, whose drain is connected to one of the nodes, and whose gate is connected to the other one of the nodes; and a second transistor whose source is connected to the other one of the complementary data lines, whose drain is connected to the other one of the nodes, and whose gate is connected to the one of the nodes;

the precharge circuit comprises: a third transistor whose drain is connected to the one of the nodes, whose source is connected to a precharge power supply line of the nodes, and whose gate is connected to an activation signal line to which a precharge activation signal is input; a four th transistor whose drain is connected to the other one of the nodes, whose source is connected to the precharge power supply line of the nodes, and whose gate is connected to the activation signal line to which the precharge activation signal is input; and a fifth transistor whose source and drain, or drain and source, are connected to the nodes, respectively, and whose gate is connected to the activation signal line to which the precharge activation signal is input;

the voltage difference amplification circuit comprises: a sense amplifier low side amplification circuit, comprising: a sixth transistor whose drain is connected to the one of the nodes, whose source is connected to a sense amplifier low side driving line, and whose gate is connected to the other one of the nodes; and a seventh transistor whose drain is connected to the other one of the nodes, whose source is connected to the sense amplifier low side driving line, and whose gate is connected to the one of the nodes; and a sense amplifier high side amplification circuit, comprising: an eighth transistor whose drain is connected to the one of the nodes, whose source is connected to a sense amplifier high side driving line, and whose gate is connected to the other one of the nodes; and a ninth transistor whose drain is connected to the other one of the nodes, whose source is connected to the sense amplifier high side driving line, and whose gate is connected to the one of the nodes; and the sense amplifier connection circuit comprises a tenth transistor and an eleventh transistor for connecting or disconnecting the complementary data lines to or from the nodes.

3. The sense amplifier circuit according to claim 2, wherein after a potential difference between the nodes is amplified to a logic level by the voltage difference amplification circuit, the sense amplifier connection circuit electrically connects the complementary data lines to the nodes while bringing a potential of one of the complementary data lines having a lower potential to a low level and further amplifying a potential of one of the complementary data lines having a higher potential.

4. The sense amplifier circuit according to claim 2, wherein after a potential difference between the nodes is amplified to a logic level by the voltage difference amplification circuit, the sense amplifier connection circuit electrically connects one of the nodes to one of the complementary data lines, thereafter electrically connecting the other one of the nodes to the other one of the complementary data lines.

5. The sense amplifier circuit according to claim 1, wherein:

the current difference amplification circuit comprises: a first transistor whose source is connected to the one of the complementary data lines, whose drain is connected to the one of the nodes, and whose gate is connected to the other one of the nodes; and a second transistor whose source is connected to the other one of the complementary data lines, whose drain is connected to the other one of the nodes, and whose gate is connected to the one of the nodes;

the precharge circuit comprises: a third transistor whose drain is connected to the one of the nodes, whose source is connected to a precharge power supply line of the nodes, and whose gate is connected to an activation signal line to which a precharge activation signal is input; a four th transistor whose drain is connected to the other one of the nodes, whose source is connected to the precharge power supply line of the nodes, and whose gate is connected to the activation signal line to which the precharge activation signal is input; and a fifth transistor whose source and drain, or drain and source, are connected to the nodes, respectively, and whose gate is connected to the activation signal line to which the precharge activation signal is input;

the voltage difference amplification circuit comprises: a sense amplifier low side amplification circuit, comprising: a twelfth transistor whose drain is connected to the one of the nodes, whose source is connected to a sense amplifier low side driving line, and whose gate is connected to the other one of the nodes; and a thirteenth transistor whose drain is connected to the other one of the nodes, whose source is connected to the sense amplifier low side driving line, and whose gate is connected to the one of the nodes; and a restore circuit, comprising: a first coupling capacitor and a second coupling capacitor whose one end is connected to a restore driving signal line; a fourteenth transistor whose drain is connected to the one of the nodes, whose source is connected to the other end of the first coupling capacitor, and whose gate is connected to a power supply voltage line; a fifteenth transistor whose drain is connected to the other one of the nodes, whose source is connected to the other end of the second coupling capacitor, and whose gate is connected to the power supply voltage line; a sixteenth transistor whose drain is connected to a sense amplifier high side driving line, whose source is connected to the one of the complementary data lines, and whose gate is connected to the other end of the first coupling capacitor; and a seventeenth transistor whose drain is connected to the sense amplifier high side driving line, whose source is connected to the other one of the complementary data lines, and whose gate is connected to the other end of the second coupling capacitor; and the sense amplifier connection circuit comprises a tenth transistor and an eleventh transistor for connecting or disconnecting the complementary data lines to or from the nodes.

6. The sense amplifier circuit according to claim 5, wherein after a potential difference between the nodes is amplified to a logic level by the voltage difference amplification circuit, the sense amplifier connection circuit electrically connects the complementary data lines to the nodes.

7. The sense amplifier circuit according to claim 5, wherein after a potential difference between the nodes is amplified to a logic level by the voltage difference amplification circuit, the sense amplifier connection circuit electrically connects the complementary data lines to the nodes while bringing a potential of one of the complementary data lines having a lower potential to a low level and further amplifying a potential of one of the complementary data lines having a higher potential.

8. The sense amplifier circuit according to claim 5, wherein after a potential difference between the nodes is amplified to a logic level by the voltage difference amplification circuit, the sense amplifier connection circuit electrically connects one of the nodes to one of the complementary data lines, thereafter electrically connecting the other one of the nodes to the other one of the complementary data lines.

9. The sense amplifier circuit according to claim 1, wherein after a potential difference between the nodes is amplified to a logic level by the voltage difference amplification circuit, the sense amplifier connection circuit electrically connects the complementary data lines to the nodes.

10. The sense amplifier circuit according to claim 2, wherein after a potential difference between the nodes is amplified to a logic level by the voltage difference amplification circuit, the sense amplifier connection circuit electrically connects the complementary data lines to the nodes.

11. The sense amplifier circuit according to claim 1, wherein after a potential difference between the nodes is amplified to a logic level by the voltage difference amplification circuit, the sense amplifier connection circuit electrically connects the complementary data lines to the nodes while bringing a potential of one of the complementary data lines having a lower potential to a low level and further amplifying a potential of one of the complementary data lines having a higher potential.

12. The sense amplifier circuit according to claim 1, wherein after a potential difference between the nodes is amplified to a logic level by the voltage difference amplification circuit, the sense amplifier connection circuit electrically connects one of the nodes to one of the complementary data lines, thereafter electrically connecting the other one of the nodes to the other one of the complementary data lines.

13. The sense amplifier circuit according to claim 1, further comprising a booster circuit for boosting a voltage of each of the complementary data lines to a potential which is one half of a power supply voltage of the semiconductor memory device.

* * * * *